US011003013B2

(12) United States Patent
Katsuta

(10) Patent No.: US 11,003,013 B2
(45) Date of Patent: May 11, 2021

(54) DISPLAY DEVICE

(71) Applicant: Japan Display Inc., Minato-ku (JP)

(72) Inventor: Tadayoshi Katsuta, Tokyo (JP)

(73) Assignee: Japan Display Inc., Minato-ku (JP)

( * ) Notice: Subject to any disclaimer, the term of this patent is extended or adjusted under 35 U.S.C. 154(b) by 13 days.

(21) Appl. No.: 16/530,395

(22) Filed: Aug. 2, 2019

(65) Prior Publication Data

US 2020/0012144 A1 Jan. 9, 2020

Related U.S. Application Data

(63) Continuation of application No. 15/697,545, filed on Sep. 7, 2017, now Pat. No. 10,409,102.

(30) Foreign Application Priority Data

Sep. 8, 2016 (JP) .................................. 2016-175373
Sep. 8, 2016 (JP) .................................. 2016-175374

(51) Int. Cl.
*G02F 1/1345* (2006.01)
*G02F 1/1335* (2006.01)
*H01L 27/32* (2006.01)
*G09G 3/36* (2006.01)
*G02F 1/1362* (2006.01)

(52) U.S. Cl.
CPC ...... *G02F 1/133512* (2013.01); *G02F 1/1345* (2013.01); *G09G 3/3648* (2013.01); *H01L 27/3295* (2013.01); *H01L 27/3297* (2013.01); *G02F 1/136286* (2013.01); *G02F 1/136295* (2021.01); *G02F 2201/44* (2013.01);
(Continued)

(58) Field of Classification Search
CPC ............ G02F 1/133512; G02F 1/1345; G02F 1/136295; G02F 2201/44; G02F 2201/56; G02F 1/136286; G09G 3/3648; G09G 2300/0426; G09G 2320/0223; H01L 27/3295; H01L 27/3297; H01L 27/3276; H01L 27/3246; H01L 27/3279
See application file for complete search history.

(56) References Cited

U.S. PATENT DOCUMENTS

2002/0075440 A1* 6/2002 Deane .................. G02F 1/1345
349/149
2003/0076458 A1* 4/2003 Matsushima ..... G02F 1/136209
349/110

(Continued)

FOREIGN PATENT DOCUMENTS

CN 2008-292995 12/2008
JP 2009-122636 6/2009

*Primary Examiner* — Jose R Soto Lopez
(74) *Attorney, Agent, or Firm* — Oblon, McClelland, Maier & Neustadt, L.L.P.

(57) ABSTRACT

A light shielding layer overlapping with a peripheral region of a display device includes extension portions each extending along a Y direction, bent portions located between the extension portions, and another extension portion located between the bent portions. In a region overlapping with the another extension portion, an enable line (first potential supply line), which supplies a potential to a plurality of scanning signal lines via a driving circuit (first driving circuit), goes through a wiring layer (first wiring layer) and another wiring layer (second wiring layer) made of a material having resistivity lower than that of the wiring layer.

13 Claims, 18 Drawing Sheets

(52) U.S. Cl.
CPC . *G02F 2201/56* (2013.01); *G09G 2300/0426* (2013.01); *G09G 2320/0223* (2013.01)

(56) References Cited

U.S. PATENT DOCUMENTS

| | | | | |
|---|---|---|---|---|
| 2006/0077191 | A1* | 4/2006 | Ming-Daw | G02F 1/133351 345/204 |
| 2008/0012794 | A1* | 1/2008 | Battersby | G02F 1/1345 345/55 |
| 2008/0018557 | A1* | 1/2008 | Maeda | G02F 1/167 345/55 |
| 2008/0018583 | A1* | 1/2008 | Knapp | G02F 1/134309 345/99 |
| 2008/0048934 | A1* | 2/2008 | Yamamoto | G09G 3/3611 345/55 |
| 2008/0088568 | A1* | 4/2008 | Haga | G09G 3/18 345/100 |
| 2008/0158124 | A1* | 7/2008 | Kim | G09G 3/3648 345/92 |
| 2008/0266210 | A1* | 10/2008 | Nonaka | G11C 19/28 345/55 |
| 2009/0102758 | A1* | 4/2009 | Anzai | G09G 3/2096 345/76 |
| 2009/0115933 | A1* | 5/2009 | Mimura | G02F 1/133606 349/59 |
| 2009/0121984 | A1* | 5/2009 | Yamamoto | G09G 3/3266 345/76 |
| 2009/0189835 | A1* | 7/2009 | Kim | G09G 3/3677 345/80 |
| 2009/0195721 | A1* | 8/2009 | Tanahara | G02F 1/136213 349/39 |
| 2010/0020277 | A1* | 1/2010 | Morita | G02F 1/136209 349/110 |
| 2010/0134743 | A1* | 6/2010 | Shin | G09G 3/20 349/143 |
| 2010/0141570 | A1* | 6/2010 | Horiuchi | G09G 3/3611 345/100 |
| 2010/0156945 | A1* | 6/2010 | Yoshida | G02F 1/1345 345/690 |
| 2010/0289994 | A1* | 11/2010 | Nonaka | G09G 3/20 349/108 |
| 2013/0057459 | A1* | 3/2013 | Kuo | G02F 1/136286 345/84 |
| 2014/0001253 | A1* | 1/2014 | Smith | G06Q 20/3276 235/375 |
| 2014/0028961 | A1* | 1/2014 | Yanagisawa | G02F 1/136286 349/106 |
| 2014/0078027 | A1* | 3/2014 | Noh | G02F 1/136286 345/77 |
| 2014/0159204 | A1* | 6/2014 | Ma | G02F 1/13452 257/536 |
| 2014/0253419 | A1* | 9/2014 | Tanada | G09G 3/20 345/55 |
| 2015/0002777 | A1* | 1/2015 | Sugisaka | G02F 1/134336 349/46 |
| 2015/0301266 | A1* | 10/2015 | Araki | G02B 6/0088 349/65 |
| 2015/0355487 | A1* | 12/2015 | Emmert | G02F 1/13454 349/33 |
| 2016/0019856 | A1* | 1/2016 | Tanaka | G09G 3/3677 345/206 |
| 2016/0054971 | A1* | 2/2016 | Yu | H04N 7/15 345/2.1 |
| 2016/0086362 | A1* | 3/2016 | Suzuki | G06T 11/206 345/440 |
| 2016/0113106 | A1* | 4/2016 | Kim | G02F 1/1333 361/749 |
| 2016/0131946 | A1* | 5/2016 | Kim | G02F 1/133711 349/130 |
| 2016/0189664 | A1* | 6/2016 | Lee | H01L 27/124 345/208 |
| 2016/0190166 | A1* | 6/2016 | Kim | G09G 3/3233 257/71 |
| 2016/0210893 | A1* | 7/2016 | Lee | G06F 1/163 |
| 2016/0232837 | A1* | 8/2016 | Lee | G09G 3/3275 |
| 2016/0240141 | A1* | 8/2016 | Lee | G02F 1/13454 |
| 2016/0286164 | A1* | 9/2016 | Kratz | G06T 7/246 |
| 2016/0320920 | A1* | 11/2016 | Morris | G06F 3/0416 |
| 2016/0329350 | A1* | 11/2016 | Na | G09G 3/00 |
| 2016/0335982 | A1* | 11/2016 | Park | G09G 3/20 |
| 2016/0351107 | A1* | 12/2016 | Chen | G09G 3/20 |
| 2017/0003541 | A1* | 1/2017 | Xu | G02F 1/13454 |
| 2017/0110479 | A1* | 4/2017 | Chen | G02F 1/136204 |
| 2017/0162093 | A1* | 6/2017 | Kang | G02F 1/136286 |
| 2017/0200426 | A1* | 7/2017 | Li | G09G 3/001 |
| 2017/0309689 | A1* | 10/2017 | Li | H01L 51/5246 |
| 2017/0322446 | A1* | 11/2017 | Tae | G02F 1/134309 |
| 2018/0067356 | A1* | 3/2018 | Katsuta | H01L 27/3276 |
| 2018/0240377 | A1* | 8/2018 | Xu | G02F 1/13306 |
| 2019/0317375 | A1* | 10/2019 | Morinaga | G02F 1/136259 |

* cited by examiner

DISPLAY DEVICE

CROSS-REFERENCE TO RELATED APPLICATION

The present application is a continuation of U.S. application Ser. No. 15/697,545 filed Sep. 7, 2017, and claims priority from Japanese Patent Applications No. 2016-175373 filed on Sep. 8, 2016 and No. 2016-175374 filed on Sep. 8, 2016, the contents of each of which are hereby incorporated by reference into this application.

TECHNICAL FIELD OF THE INVENTION

The present invention relates to a display device.

BACKGROUND OF THE INVENTION

A display device generally has a rectangular external shape. In recent years, however, with expansion of fields of application of the display device, there is also a display device having a shape other than a rectangle. Such display device is disclosed, for example, in Japanese Patent Application Laid-Open Publication No. 2009-122636 (Patent Document 1) and Japanese Patent Application Laid-Open Publication No. 2008-292995 (Patent Document 2).

SUMMARY OF THE INVENTION

In a display region of a display device, there are a plurality of electrodes driving an electro-optical layer, and a signal line supplying a driving signal and a scanning signal to the plurality of electrodes. In a peripheral region around the display region, a circuit supplying a signal to the above-described plurality of electrodes is disposed. In a case where a shape of the display region or a shape of an outer edge portion of the peripheral region is a shape other than a rectangle or a square, a problem may arise due to the shape of the display region or the peripheral region. In the present specification, the shape other than the rectangle or the square may be referred to as an "irregular shape" hereinafter.

For example, in a case where each length of a plurality of signal lines is different from each other due to the display region having the irregular shape, in-plane distribution of a load given to each of the signal lines becomes uneven. When the in-plane distribution of the load given to each of the signal lines becomes uneven in this way, it may cause deterioration of image quality.

Also, when each of the plurality of signal lines is made to have the same length, it is necessary to make an external shape of the peripheral region a rectangle. In this case, an area occupied by the display region in the display device is reduced.

An object of the present invention is to provide a technique for improving performance of a display device.

The typical ones of the inventions disclosed in the present application will be briefly described as follows.

A display device as one aspect of the present invention includes: a display region in which first pixels are arrayed; a peripheral region overlapping with a light shielding layer and being outside the display region; a plurality of scanning signal lines and a plurality of video signal lines within the display region; a first driving circuit and a second driving circuit supplying a scanning signal; a first potential supply line supplying a potential to the plurality of scanning signal lines via the first driving circuit; and a first wiring layer and a second wiring layer made of a material having resistivity lower than that of the first wiring layer. The plurality of video signal lines extend in a first direction. The light shielding layer includes a first extension portion and a second extension portion each extending along the first direction, a first bent portion and a second bent portion located between the first extension portion and the second extension portion, and a third extension portion located between the first bent portion and the second bent portion. The first extension portion is connected to the first bent portion, and the second extension portion is connected to the second bent portion. The first potential supply line overlaps with the third extension portion. The plurality of scanning signal lines include a first scanning signal line and a second scanning signal line. A part of the first scanning signal line overlaps with the third extension portion, and a part of the second scanning signal line overlaps with the first extension portion. In plan view, the number of the plurality of video signal lines crossed by the first scanning signal line is different from the number of the plurality of video signal lines crossed by the second scanning signal line within the display region. In a region overlapping with the third extension portion, the first potential supply line goes through the first wiring layer and the second wiring layer.

BRIEF DESCRIPTIONS OF THE DRAWINGS

DESCRIPTIONS OF THE PREFERRED EMBODIMENTS

Figure 1:
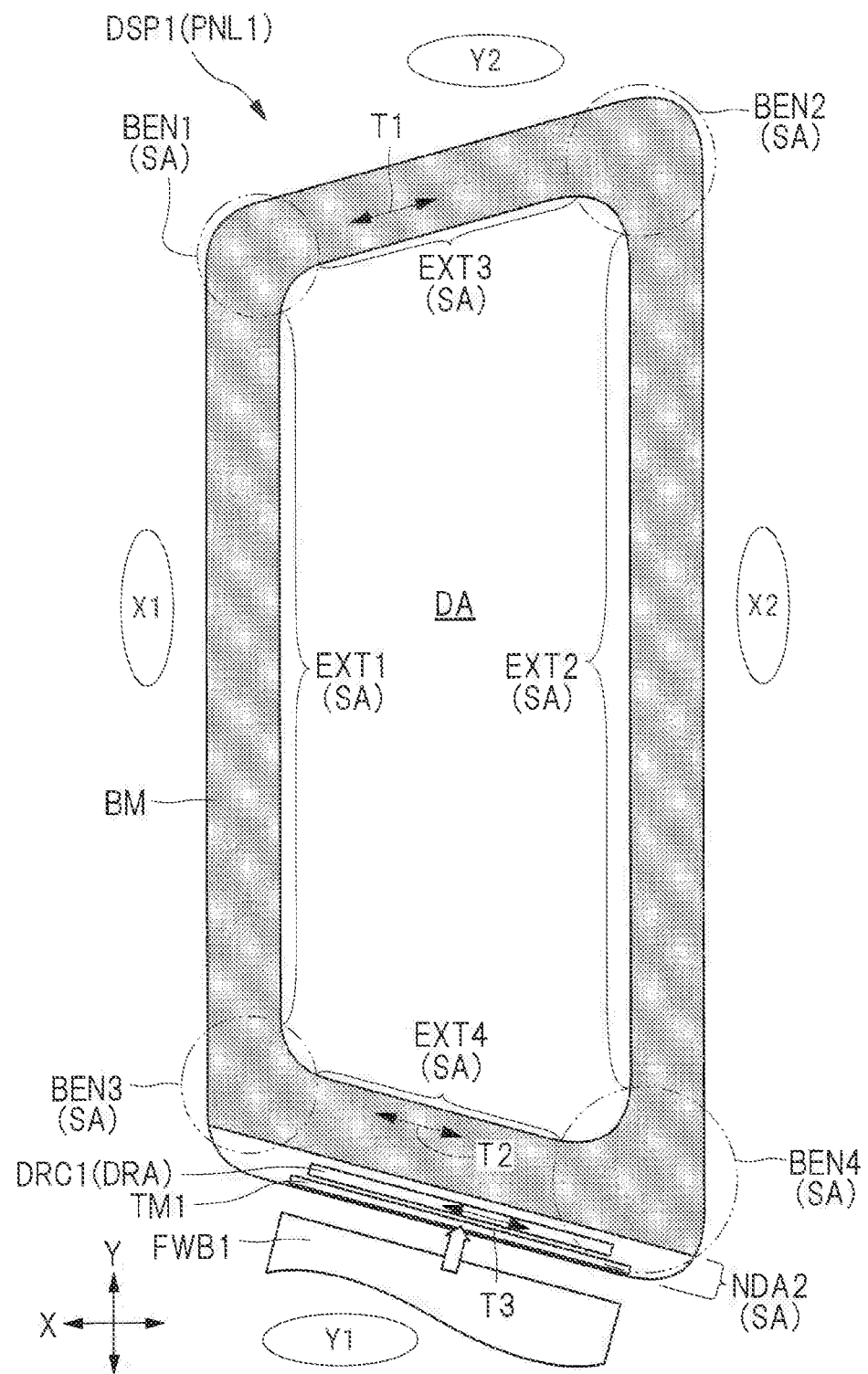
FIG. 1 is a plan view illustrating one exemplary configuration of a display device according to one embodiment.

Hereinafter, embodiments of the present invention will be described with reference to the drawings.

Note that this disclosure is an example only and suitable modifications which can be easily conceived by those skilled in the art without departing from the gist of the present invention are included within the scope of the invention as a matter of course. In addition, in order to further clarify the description, a width, a thickness, a shape, and the like of respective portions may be schematically illustrated in the drawings as compared to aspects of the embodiments, but they are examples only and do not limit the interpretation of the present invention.

In addition, in this specification and the respective drawings, the same components described in the drawings which have been described before are denoted by the same reference characters, and detailed description thereof may be omitted as needed.

Further, hatching which is applied in order to distinguish a structure is sometimes omitted in the drawings used in the embodiments depending on the drawing.

Also, a technique described in an embodiment below is widely applicable to a display device provided with a mechanism in which a signal from a periphery of a display region is supplied to a plurality of elements in the display region provided with an electro-optical layer. The electro-optical layer is a layer provided with an element having a function of forming a display image and being driven by an electric control signal. Various display devices may be exemplified as the above-described display device such as a liquid crystal display device, an organic electro-luminescence (EL) display device, and a plasma display device, for example. In the embodiment below, the liquid crystal display device is selected and described as a typical example of the display device.

The liquid crystal display device is roughly classified into the following two, depending on a direction of applying an electric field for changing alignment of a liquid crystal molecule in a liquid crystal layer serving as a display functional layer. That is, as a first category, there is a so-called vertical electric field mode in which the electric field is applied in a thickness direction (or an out-of-plane direction) of the display device. In the vertical electric field mode, for example, there are a twisted nematic (TN) mode, a vertical alignment (VA) mode, and the like. As a second category, there is a so-called horizontal electric field mode in which the electric field is applied in a plane direction (or an in-plane direction) of the display device. In the horizontal electric field mode, for example, there are an in-plane switching (IPS) mode, a fringe field switching (FFS) mode which is one of the IPS modes, and the like. Although the technique described below is applicable to any of the vertical electric field mode and the horizontal electric field mode, a display device of the horizontal electric field mode will be described in the embodiment below, by way of example.

<Configuration of Display Device>

Figure 2:
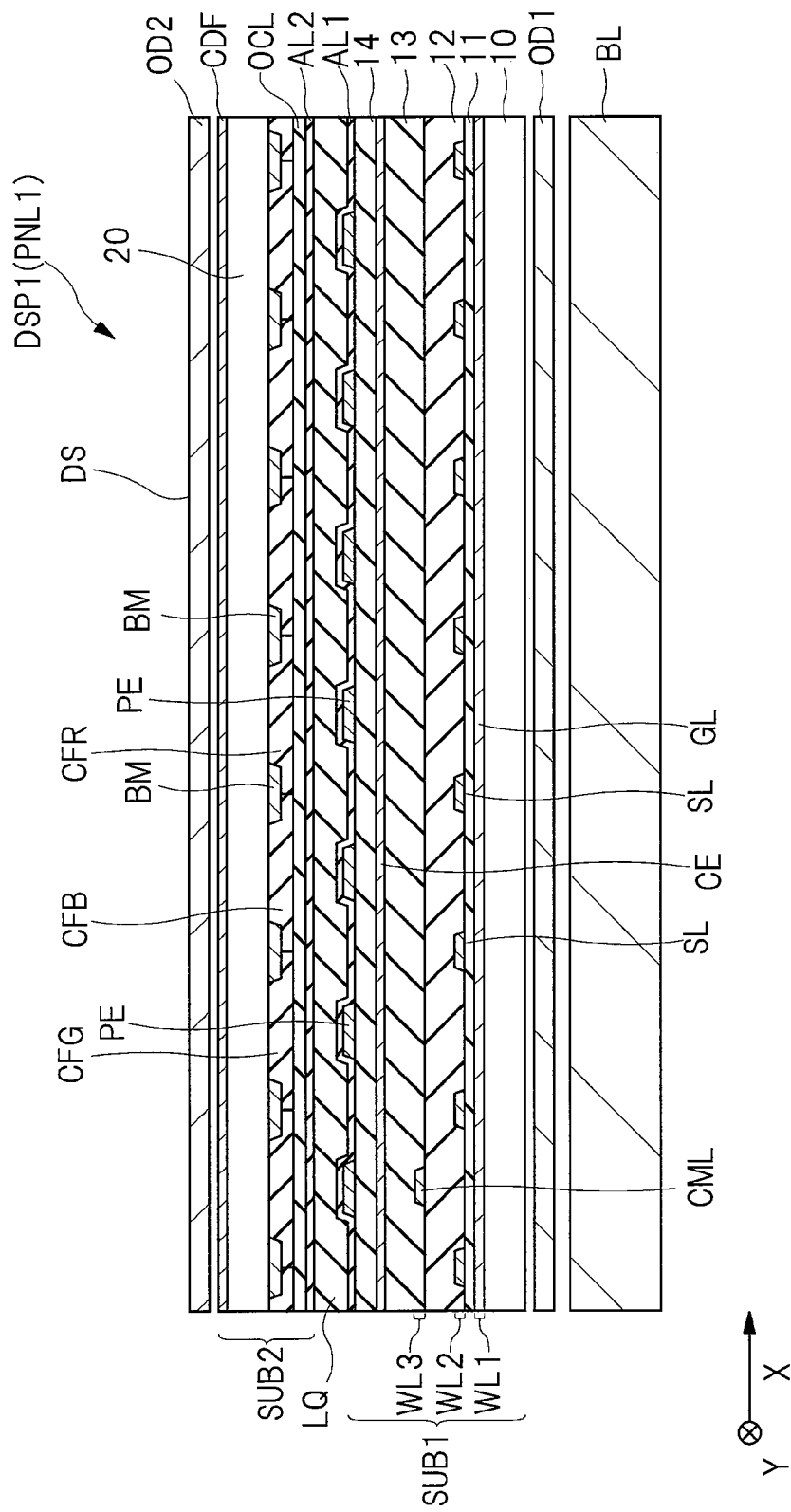
FIG. 2 is an enlarged cross-sectional view illustrating a part of a display region of the display device illustrated in FIG. 1.
Figure 3:
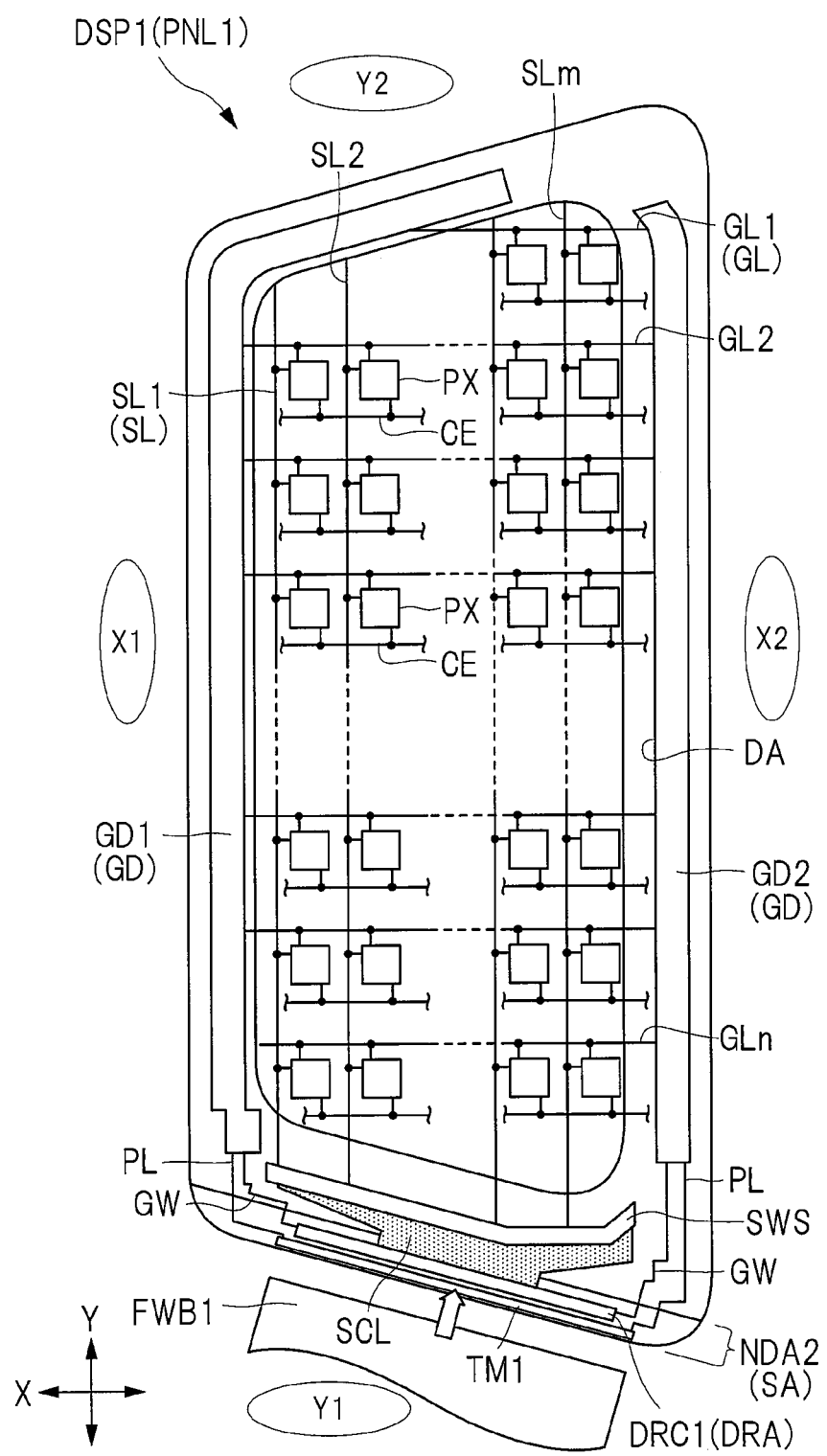
FIG. 3 is a plan view illustrating an exemplary arrangement of a common electrode in the display device illustrated in FIG. 1.
Figure 4:
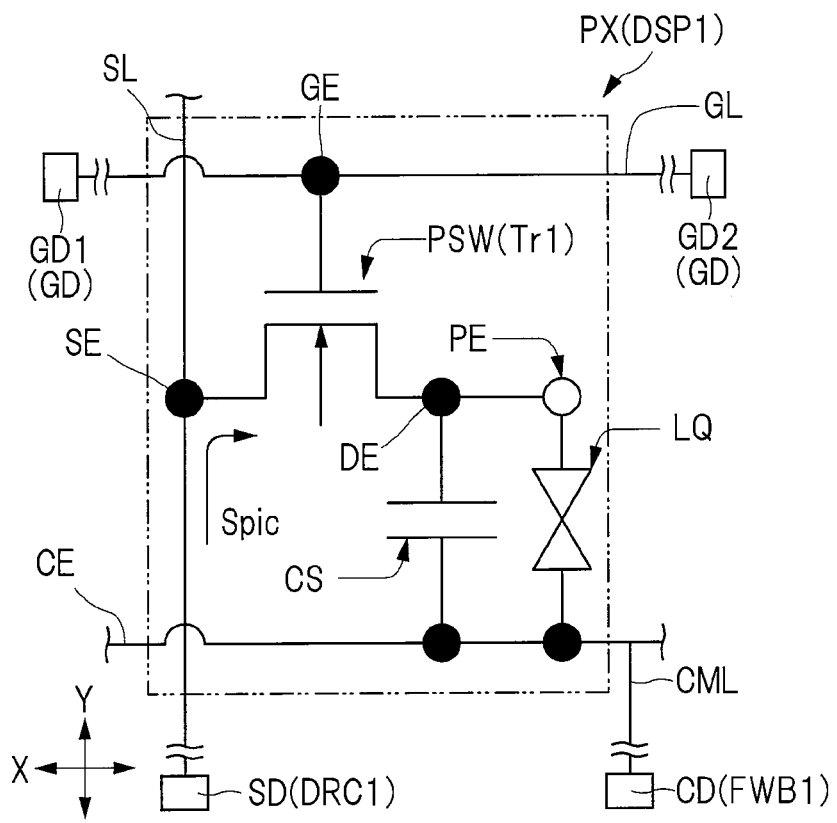
FIG. 4 is an equivalent circuit diagram illustrating a pixel in the display device illustrated in FIG. 1.
Figure 5:
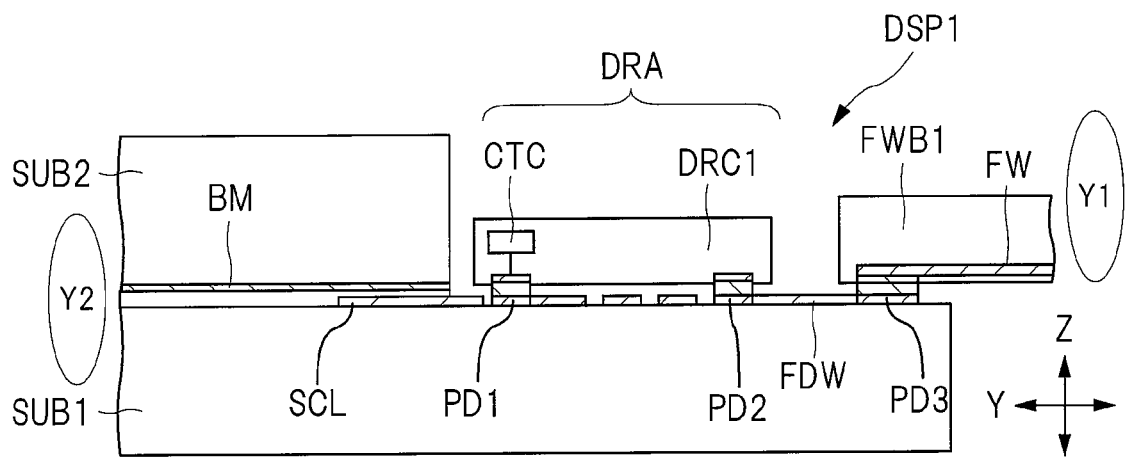
FIG. 5 is an enlarged cross-sectional view illustrating a connecting part between a driver chip and a substrate illustrated in FIG. 1.
Figure 6:
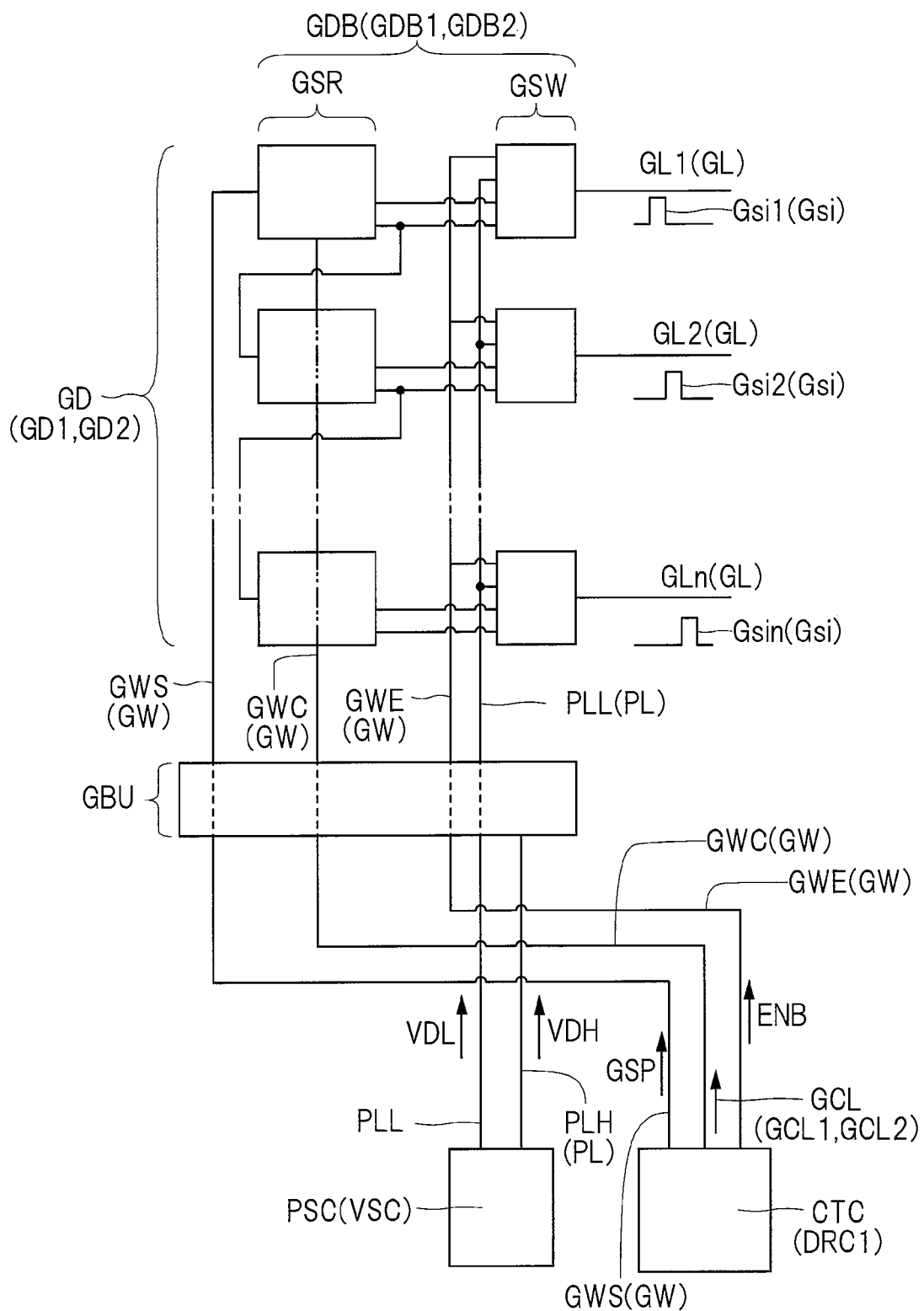
FIG. 6 is a circuit block diagram illustrating an exemplary configuration of a scanning signal line driving circuit illustrated in FIG. 1.

FIG. 1 is a plan view illustrating one exemplary configuration of a display device according to one embodiment. FIG. 2 is an enlarged cross-sectional view illustrating a part of a display region of the display device illustrated in FIG. 1. FIG. 3 is a plan view illustrating an exemplary circuit layout in the display device illustrated in FIG. 1. FIG. 4 is an equivalent circuit diagram illustrating a pixel in the display device illustrated in FIG. 3. FIG. 5 is an enlarged cross-sectional view illustrating a connecting part between a driver chip and a substrate illustrated in FIG. 1. FIG. 6 is a circuit block diagram illustrating an exemplary configuration of a scanning signal line driving circuit illustrated in FIG. 1. Note that, in FIG. 1, a part of a peripheral region SA overlapping with a light shielding layer BM is indicated with a pattern having a darker color than that of a display region DA. Also, in FIG. 2, to illustrate an exemplary positional relation between a scanning signal line GL and a video signal line SL in a thickness direction of a substrate SUB1, the scanning signal line GL, which is provided to a cross-section different from FIG. 2, is also illustrated. Also, to a switching circuit SWS illustrated in FIG. 3, a large number of video signal connecting lines SCL are connected, and in FIG. 3, a region in which a large number of video signal connecting lines SCLs are arranged is indicated with a dotted pattern.

As illustrated in FIG. 1, a display device DSP1 includes a display panel PNL1 and a driver chip DRC1 mounted on the display panel PNL1. The display panel PNL1 has a display surface DS (see FIG. 2) on which an image is displayed. The driver chip DRC1 is an integrated circuit (IC) chip provided with a control circuit for controlling driving of the display panel PNL1. The display device DSP1 also includes a wiring board (wiring portion) FWB1, which is a wiring member connected to the display panel PNL1. The wiring board FWB1 is a flexible wiring board having a plurality of wirings covered with resin. The wiring board FWB1 is connected to a terminal portion TM1 of the display panel PNL1 as schematically illustrated with an arrow in FIG. 1. To the terminal portion TM1, not only an electric signal such as a driving signal and a video signal but also a power supply voltage for driving the display panel PNL1 is supplied from an external circuit of the display panel PNL1 via the wiring board FWB1.

Also, the display panel PNL1 is provided with the display region DA, in which a plurality of pixels (first pixels) PX (see FIG. 3) are arrayed, and the peripheral region SA outside the display region DA. In the example illustrated in FIG. 1, the display region DA is trapezoidal, and a long side and a short side extending in parallel to each other extend along a Y direction. Also, in the example illustrated in FIG. 1, the Y direction is a longer direction of the display region DA. The display region DA is a region in which an image visible from a display surface DS (see FIG. 2) side is displayed based on a signal input into the display device DSP1. In plan view, the peripheral region SA is disposed so as to continuously surround a periphery of the display region DA. In plan view, a side (end) on an inner side of the peripheral region SA is in contact with an outer edge portion of the display region DA. In the display region DA, the plurality of pixels PX are arrayed. For example, as illustrated in FIG. 3, in plan view, two directions crossing each other, preferably orthogonal to each other, are referred to as an X direction and a Y direction. In plan view, the plurality of pixels PX are arrayed in the X direction and the Y direction in a matrix within the display region DA. Note that, in the present application, "in plan view" means a view viewed from a direction perpendicular to the display surface of the display panel PNL1.

Also, the peripheral region SA is a non-display region in which the image, which is visible from outside, is not displayed and is disposed so as to surround the periphery of the display region DA. The peripheral region SA is the non-display region, and most of the peripheral region SA overlaps with the light shielding layer BM.

Also, as illustrated in FIG. 2, the display panel PNL1 includes the substrate SUB1, a substrate SUB2 disposed facing the substrate SUB1, and a liquid crystal layer LQ serving as an electro-optical layer disposed between the substrate SUB1 and the substrate SUB2. In other words, the display device DSP1 according to this embodiment is a liquid crystal display device provided with the liquid crystal layer LQ serving as the electro-optical layer. In other words, note that the substrate SUB1 is an array substrate, and the substrate SUB2 is a counter substrate in this embodiment.

As illustrated in FIG. 1, the driver chip DRC1 and the terminal portion TM1 are in a region (exposed region) NDA2 not overlapping with the light shielding layer BM, of the peripheral region SA of the display panel PNL1. When one side in the Y direction illustrated in FIG. 1 is referred to as a Y1 side and the other side therein is referred to as a Y2 side, the region NDA2 is on the Y1 side of the display region DA in the Y direction. As illustrated in FIG. 2, in the display panel PNL1, the substrate SUB1 and the substrate SUB2 face each other in the most part in plan view. However, the region NDA2 illustrated in FIG. 1 is exposed from the substrate SUB2 (see FIG. 5). In an example illustrated in FIG. 5, the light shielding layer BM is formed in the substrate SUB2, and the region NDA2 (see FIG. 1) does not overlap with the light shielding layer BM. Note that the light shielding layer BM is also disposed within the display region DA in addition to the peripheral region SA. In plan view, the light shielding layer BM is provided so as to surround a periphery of each of the plurality of pixels PX in the display region DA (see FIG. 3).

The driver chip DRC1 is mounted in a region DRA in the peripheral region SA (more specifically, the region NDA2). As illustrated in FIG. 5, in the region DRA of the substrate SUB1, a terminal PD1 and a terminal PD2 are disposed, and the driver chip DRC1 is connected to the terminal PD1 and the terminal PD2. The terminal PD1 is an interface electrically connecting a circuit formed in the driver chip DRC1 to a circuit formed in the display panel PNL1 (see FIG. 1). Also, the terminal PD2 is an interface electrically connecting the driver chip DRC1 with the wiring board FWB1. The driver chip DRC1 is connected with a terminal PD3 via the terminal PD2 and a wiring FDW. Also, to the terminal PD3, a wiring FW of the wiring board FWB1 is connected. Also, as illustrated in FIG. 1, at least a part of the driver chip DRC1 (for example, a long side) extends along a direction T3 that is inclined relative to each of the Y direction and the X direction.

As illustrated in FIG. 4, the display device DSP1 has a video signal line driving circuit SD. The video signal line driving circuit SD is electrically connected to a pixel PX to drive the liquid crystal layer LQ serving as the electro-optical layer via the video signal line SL. In the example of this embodiment, the video signal line driving circuit SD is formed in the driver chip DRC1. The video signal line driving circuit SD supplies a video signal Spic to a pixel electrode (first electrode) PE provided to each of the plurality of pixels PX via the video signal line SL. Also, as illustrated in FIG. 6, the driver chip DRC1 includes a control circuit (first control circuit) CTC supplying a control signal to a driving circuit via a control wiring GW. The control circuit CTC is electrically connected to the driving circuit via the terminal PD1 (see FIG. 5).

In this embodiment, as illustrated in FIG. 5, there is described an example in which the driver chip DRC1 is mounted on the substrate SUB1. Note that there are various modifications of a position of the driver chip DRC1 and a position of the control circuit CTC besides those in the region DRA illustrated in FIG. 1. For example, the driver chip DRC1 may also be mounted on the wiring board FWB1. In such case, the wiring board FWB1 is connected to the terminal PD1. Accordingly, even in a case where the driver chip DRC1 is mounted on the wiring board FWB1, the control circuit CTC of the driver chip DRC1 is electrically connected to the driving circuit via the terminal PD1 in the region DRA.

As illustrated in FIG. 3, the display device DSP1 includes a plurality of video signal lines SL and a plurality of pixels PX. In the display region DA, the plurality of pixels PX are arranged between the substrate SUB1 and the substrate SUB2 (see FIG. 2). The plurality of pixels PX are arrayed in the X direction and the Y direction in a matrix and arranged m by n (when m and n are positive integers). Each of the plurality of video signal lines SL extends in the Y direction and is arrayed in the X direction at an interval from each other. Each of the plurality of pixels PX is partitioned by the video signal lines SL in the X direction. Accordingly, the number of the pixels PX arrayed along the X direction corresponds to the number of the video signal lines SL. In the example illustrated in FIG. 3, m video signal lines SL are arrayed in an order of video signal lines SL1, SL2, and SLm, from X1 which is one side in the X direction, toward X2 which is the other side therein. Each of the plurality of video signal lines SL is drawn out to the peripheral region SA outside the display region DA. Each of the plurality of video signal lines SL is electrically connected with the driver chip DRC1 via the video signal connecting lines SCL as connecting wirings (also referred to as lead-out wirings) interconnecting the video signal lines SL within the display region DA and the driver chip DRC1.

The video signal lines SL and the video signal connecting lines SCL are video lines functioning as wirings transmitting a video signal, and the video signal lines SL and the video signal connecting lines SCL can be distinguished from each other as follows. That is, of the video line serving as a signal transmission path connected to the driver chip DRC1 and supplying the video signal to the plurality of pixels PX, a part (wiring portion) thereof in a position overlapping with the display region DA is referred to as the video signal lines SL. A part (wiring portion) of the above-described video lines outside the display region DA is referred to as the video signal connecting lines SCL (or as a lead-out wiring). Each of the plurality of video signal lines SL extends linearly in the Y direction. In contrast, since the video signal connecting lines SCL are the wirings connecting the video signal lines SL and the driver chip DRC1, as illustrated in FIG. 3, the video signal connecting lines SCL have bent portions between the video signal lines SL and the driver chip DRC1.

In the example illustrated in FIG. 3, there is a switching circuit (selection circuit) SWS between the video signal lines SL and the video signal connecting lines SCL. The switching circuit SWS is a multiplexer circuit constituted by a plurality of transistors, for example, and outputs a signal that has been input by selecting from the video signal line SL for each color. The switching circuit SWS operates as a selection switch selecting a type of the video signal such as a red signal, a green signal, or a blue signal, for example. In other words, the switching circuit SWS is a selection circuit selecting a type of the video signal Spic (see FIG. 4) supplied to the video signal lines SL. In this case, the number of the video signal connecting lines SCL connecting the switching circuit SWS and the driver chip DRC1 is smaller than the number of the video signal lines SL. In this way, by providing the switching circuit SWS, it is possible to reduce the number of the video signal connecting lines SCL, whereby it is possible to reduce the number of the video signal connecting lines SCL between the driver chip DRC1 and the switching circuit SWS. In a case where the switching circuit SWS is provided as illustrated in FIG. 3, it is possible to distinguish between the video signal lines SL and the video signal connecting lines SCL as follows. That is, a part (wiring portion) connecting the driver chip DRC1 and the switching circuit SWS is referred to as the video signal connecting lines SCL. Also, from a part (wiring portion) of the video line in a position overlapping with the display region DA to a part (wiring portion) thereof connected to the switching circuit SWS is referred to as the video signal lines SL.

Also, as illustrated in FIG. 3, the switching circuit SWS is curved conforming to a shape of a side on the Y1 side of the display region DA. More specifically, since the switching circuit SWS is constituted by the plurality of transistors, an array line of the plurality of transistors constituting the switching circuit SWS is curved along the shape of the side on the Y1 side of the display region DA. Since the switching circuit SWS is curved along the side on the Y1 side of the display region DA in this way, of the peripheral region SA, it is possible to reduce an area of a part on the Y1 side (bent portions BEN3 and BEN4 and an extension portion EXT4 illustrated in FIG. 1).

Also, the display device DSP1 includes a plurality of scanning signal lines GL, and a driving circuit GD as a scanning signal output circuit outputting a scanning signal Gsi input into the plurality of scanning signal lines GL (see FIG. 6). The driving circuit is provided on the substrate SUB1 in the peripheral region SA (see FIG. 1). The driver chip DRC1 is connected to the driving circuit via the control wiring GW. Each of the plurality of scanning signal lines GL extends in the X direction and is arrayed in the Y direction at an interval from each other. Each of the plurality of pixels PX is partitioned by each of the scanning signal lines GL in the Y direction. Accordingly, the number of the pixels PX arrayed along the Y direction corresponds to the number of the scanning signal lines GL. In the example illustrated in FIG. 3, n scanning signal lines GL are arrayed in an order of scanning signal lines GL1, GL2, and GLn from one side to the other side in the Y direction. Each of the plurality of scanning signal lines GL is drawn out to the peripheral region SA outside the display region DA and is connected to the driving circuit. Also, the plurality of scanning signal lines GL mutually cross the plurality of video signal lines SL. The scanning signal line GL includes a gate electrode GE of a transistor (pixel transistor) Tr1 serving as a pixel switch element PSW illustrated in FIG. 4.

In FIG. 3, a region in which the driving circuit GD is provided is schematically illustrated being surrounded with a frame. The driving circuit includes multiple types of circuit portions. For example, as illustrated in FIG. 6, the driving circuit GD includes a shift register circuit GSR, and a switching circuit (scanning signal switching circuit) GSW connected to the shift register circuit GSR and selecting a potential to be supplied to the scanning signal line GL based on a control signal. Also, the driving circuit GD is connected to the driver chip DRC1 via the control wiring GW. The driver chip DRC1 supplies a control signal such as a clock signal GCL and an enable signal ENB to the driving circuit GD via the control wiring GW.

In the example illustrated in FIG. 6, the clock signal GCL is transmitted to each of a plurality of shift register circuits GSR of the driving circuit GD via a clock line GWC. The enable signal ENB is transmitted to each of the plurality of switching circuits GSW of the driving circuit GD via an enable line GWE. The enable line GWE is a potential supply line supplying the potential as the scanning signal Gsi to the scanning signal line GL. In the example illustrated in FIG. 6, a scanning signal Gsi1 is supplied to the scanning signal line GL1, a scanning signal Gsi2 is supplied to the scanning signal line GL2, and a scanning signal Gsin is supplied to the scanning signal line GLn. As schematically illustrated in FIG. 6, each of the plurality of scanning signals Gsi is a pulse signal having a voltage level that changes corresponding to a timing of the clock signal GCL. A start pulse signal GSP is transmitted to the shift register circuit GSR that is driven first among the plurality of shift register circuits GSR via a start pulse line GWS.

In the example illustrated in FIG. 6, a set of the shift register circuit GSR and the switching circuit GSW constitutes a circuit block GDB1 or GDB2, and each of the circuit blocks GDB1 and GDB2 is connected to the scanning signal line GL. In FIG. 6, for easy understanding, one switching circuit GSW is connected to one shift register circuit GSR, and the scanning signal line GL is connected to each of the switching circuits GSW. However, there are various modifications of a circuit configuration of the circuit blocks GDB1 and GDB2. For example, it is also possible to connect the plurality of switching circuits GSW to one shift register circuit GSR.

Furthermore, a buffer circuit GBU is connected between the driving circuit GD and the driver chip DRC1. The buffer circuit GBU is a circuit relaying the potential to be supplied to the scanning signal line GL via the driving circuit GD. In a case where the buffer circuit GBU is interposed in a transmission path of the control signal, a waveform of a gate signal supplied to the driving circuit GD is corrected by the buffer circuit GBU. As illustrated in FIG. 6, the buffer circuit GBU and a power supply circuit PSC are connected to each other via a power supply wiring PL supplying a power supply potential to the driving circuit GD. More specifically, the buffer circuit GBU and the power supply circuit PSC are connected to each other via a wiring PLH in which a relatively high potential VDH is supplied and a wiring PLL in which a potential lower than the potential VDH is supplied. In the buffer circuit GBU, by using the potential VDH and a potential VDL, a waveform of the control signal such as the enable signal ENB is corrected and is output to the driving circuit GD. The power supply circuit PSC illustrated in FIG. 6 is formed in the wiring board FWB1, for example. As a modification, the power supply circuit PSC may also be formed outside the display device DSP1 and may be connected to the buffer circuit GBU through the wiring board FWB1.

In the example illustrated in FIG. 3, the driving circuit GD is disposed both on an X1 side which is one side, and an X2 side which is the other side, in the X direction. More specifically, in the X direction, there are a driving circuit (scanning signal line driving circuit, first driving circuit) GD1 on the X1 side and a driving circuit (scanning signal line driving circuit, second driving circuit) GD2 on the X2 side. Also, in the X direction, the display region DA is a region between the driving circuit GD1 and the driving circuit GD2. As illustrated in FIG. 3, a driving method in a state where the driving circuit GD is connected to both ends of the scanning signal lines GL is referred to as a both-side driving method of the scanning signal lines GL. Note that there are various modifications of a layout of the driving circuit GD. For example, in the X direction illustrated in FIG. 3, the driving circuit GD may also be disposed on any one of the X1 side and the X2 side. A driving method in a state where the driving circuit GD is connected to one end of the scanning signal lines GL while the driving circuit GD is not connected to the other end thereof is referred to as a one-side driving method of the scanning signal line GL. Also, for example, it is also possible that no buffer circuit GBU (see FIG. 6) is connected between the driver chip DRC1 and the driving circuit GD.

Also, as illustrated in FIG. 2, the display device DSP1 includes a common electrode (second electrode) CE. Also, as illustrated in FIG. 4, the display device DSP1 includes a common electrode driving circuit (also referred to as a common potential circuit) CD driving the common electrode CE when the display device DSP1 displays an image. The common electrode CE is electrically connected to the common electrode driving circuit CD via a common line CML. In the example illustrated in FIG. 4, the common electrode driving circuit CD is formed in the wiring board FWB1. The common electrode CE is an electrode in which a potential common to each of the plurality of pixels is supplied. Accordingly, one common electrode CE may be provided so as to overlap with the display region DA. Note that it is also possible to provide the common electrode CE that is divided into a plurality of electrodes so as to overlap with the display region DA.

Note that there are various modifications of a position where the common electrode driving circuit CD is formed in addition to an aspect illustrated in FIG. 3. For example, the common electrode driving circuit CD may be formed in the driver chip DRC1. Furthermore, for example, an embodiment in which the common electrode driving circuit CD is disposed on the substrate SUB1 illustrated in FIG. 1 is also included in the aspect in which the common electrode driving circuit CD is formed in the peripheral region SA. It is also possible that, for example, the common electrode driving circuit CD is formed outside the display device DSP1 and is connected to the wiring board FWB1.

As illustrated in FIG. 4, the pixel PX includes the pixel switch element PSW, and a pixel electrode PE. Also, in the example of this embodiment, the plurality of pixels PX share the common electrode CE. The pixel switch element PSW includes, for example, the transistor Tr1 that is a thin film transistor (TFT). The pixel switch element PSW is electrically connected to the scanning signal line GL and the video signal line SL. More specifically, a source electrode SE of the transistor Tr1 serving as the pixel switch element PSW is connected to the video signal lines SL, and a drain electrode DE thereof is connected to the pixel electrode PE. Also, the gate electrode GE of the transistor Tr1 is included in the scanning signal line GL. The driving circuit (see FIG. 3) supplies the potential (scanning signal Gsi illustrated in FIG. 6) to the gate electrode GE and controls a state of supply of the video signal Spic to the pixel electrode PE by on-off operating the pixel switch element PSW. In other words, the transistor Tr1 functions as the pixel switch element PSW controlling supply of the potential to the pixel electrode PE. The pixel switch element PSW may be either of a top gate type TFT or a bottom gate type TFT. Also, a material of a semiconductor layer of the pixel switch element PSW is polycrystalline silicon (polysilicon), for example; however, it may also be an oxide semiconductor or amorphous silicon.

The pixel electrode PE is opposed to the common electrode CE interposing an insulating film 14 (see FIG. 2). The common electrode CE, the insulating film 14, and the pixel electrode PE form a holding capacitor CS. During a display operation period in which a display image is formed based on a video signal, an electric field is formed between the pixel electrode PE and the common electrode CE based on a driving signal applied to each of the electrodes. Then, a liquid crystal molecule constituting the liquid crystal layer LQ, which is the electro-optical layer, is driven by the electric field formed between the pixel electrode PE and the common electrode CE. For example, in the display device DSP1 using the horizontal electric field mode as in this embodiment, the pixel electrode PE and the common electrode CE are provided in the substrate SUB1 as illustrated in FIG. 2. The liquid crystal molecule constituting the liquid crystal layer LQ is rotated using the electric field (for example, in a fringe field, an electric field that is substantially in parallel to a principal surface of a substrate) formed between the pixel electrode PE and the common electrode CE.

That is, during the display operation period, each of the pixel electrode PE and the common electrode CE operates as a driving electrode driving the liquid crystal layer LQ, which is the electro-optical layer. In other words, each of the plurality of pixel electrodes PE is the first electrode driving the electro-optical layer. Furthermore, each of the common electrodes CE is the second electrode driving the electro-optical layer.

As illustrated in FIG. 2, the substrate SUB1 and the substrate SUB2 are bonded together in a state of being separated from each other. The liquid crystal layer LQ is sealed between the substrate SUB1 and the substrate SUB2. The substrate SUB1 includes an insulating substrate 10 having optical transparency, for example, a glass substrate and a resin substrate. Also, the substrate SUB1 has a plurality of conductor patterns on the insulating substrate 10 on a side thereof facing the substrate SUB2. The plurality of conductor patterns include the plurality of scanning signal lines GL, the plurality of video signal lines SL, a plurality of common lines CML, the plurality of common electrodes CE, and the plurality of pixel electrodes PE. Also, an insulating film is interposed between the conductor patterns. As the insulating films disposed between the adjacent conductor patterns and insulating the conductor patterns from each other, there are included an insulating film 11, an insulating film 12, an insulating film 13, an insulating film 14, and an alignment film AL1. Note that, in FIG. 2, one each of the scanning signal lines GL, the common electrodes CE, and the common lines CML is illustrated.

Each of the plurality of conductor patterns described above is formed in a plurality of wiring layers that are layered. In the example illustrated in FIG. 2, each of the common electrode CE and the pixel electrodes PE is formed in a different layer, and below the layer in which the common electrode CE is formed, three wiring layers are provided. In a wiring layer WL1 of a first layer that is provided the closest to the insulating substrate 10 among the three wiring layers formed over the insulating substrate 10, mainly the scanning signal line GL is formed. The conductor pattern formed in the wiring layer WL1 is made of, for example, metal such as chrome (Cr), titanium (Ti), and molybdenum (Mo), or an alloy thereof.

The insulating film 11 is formed over the wiring layer WL1 and the insulating substrate 10. The insulating film 11 is a transparent insulating film made of, for example, silicon nitride, silicon oxide, or the like. Note that, between the insulating substrate 10 and the insulating film 11, there are formed the gate electrode of the pixel switch element, the semiconductor layer, and the like in addition to the scanning signal line GL.

Over the insulating film 11, a wiring layer WL2 of a second layer is formed. In the wiring layer WL2, mainly the video signal lines SL are formed. The wiring layer (second wiring layer) WL2 is made of a material having lower resistivity than that of the wiring layer (first wiring layer) WL1. The conductor pattern formed in the wiring layer WL2 is made of a metal film having a multilayer structure, for example, in which aluminum (Al) is sandwiched with molybdenum (Mo), titanium (Ti), or the like. It is preferred that a wiring material of the wiring layer WL2 have a lower specific resistance than that of a wiring material of the wiring layer WL1. Also, the source electrode, the drain electrode, and the like of the pixel switch element are formed over the insulating film 11. In the example illustrated in in FIG. 2, the video signal lines SL extend in the Y direction. The insulating film 12 is formed over each of the video signal lines SL and the insulating film 11. The insulating film 12 is made of, for example, acrylic photosensitive resin.

Also, in the example illustrated in FIG. 2, over the insulating film 12, a wiring layer WL3 of a third layer is formed. In the wiring layer WL3, mainly the common line CML is formed. The conductor pattern formed in the wiring layer WL3, in the same way as in the wiring layer WL2, is made of a metal film having a multilayer structure, for example, in which aluminum (Al) is sandwiched with molybdenum (Mo), titanium (Ti), or the like. In the example illustrated in FIG. 2, the common line CML extends in the Y direction. The insulating film 13 is formed over each of the common line CML and the insulating film 12. The insulating film 13 is made of, for example, acrylic photosensitive resin. Note that, in FIG. 2, an example is illustrated in which wirings such as the scanning signal line GL, the video signal lines SL, and the common line CML are disposed in the three wiring layers, respectively. However, the number of the wiring layers is not limited to the above, and various modifications are possible. For example, it is possible not to provide the wiring layer WL3 illustrated in FIG. 2. In this case, the common line CML may be formed in the same layer as the layer in which the common electrode CE is formed, for example.

In FIG. 2, an enlarged cross-section of the display region DA illustrated in FIG. 1 is illustrated, and each of the wiring layers WL1, WL2, and WL3 illustrated in FIG. 2 is also disposed in the peripheral region SA illustrated in FIG. 1. The video signal connecting lines SCL, the control wiring GW, and the power supply wiring PL illustrated in FIG. 3 are formed in one or more wiring layers of the wiring layers WL1, WL2, and WL3. Furthermore, each of a plurality of circuits disposed in the peripheral region SA, such as the switching circuit SWS illustrated in FIG. 3, is formed in one or more wiring layers of the wiring layers WL1, WL2, and WL3.

As illustrated in FIG. 2, the common electrode CE is formed over the insulating film 13. It is preferred that the common electrode CE be made of a transparent conductive material such as indium tin oxide (ITO) or indium zinc oxide (IZO). Note that, in a case where the display device is a display device in the TN mode, the VA mode, or the like, which is the vertical electric field mode, the common electrode CE may also be formed in the substrate SUB2. Also, in the cross-section illustrated in FIG. 2, the insulating film 13 is interposed between the common electrode CE and the common line CML. Note that a part of the common line CML and a part of the common electrode CE are electrically connected to each other as illustrated in FIG. 4. In a case of a reflection type display device using reflection of light from the outside, the common electrode CE may also be made of a metal material.

The insulating film 14 is formed over the insulating film 13 and the common electrode CE. The pixel electrodes PE are formed over the insulating film 14. In plan view, each of the pixel electrodes PE is positioned between two adjacent video signal lines SL and is arranged in a position facing the common electrode CE. It is preferred that the pixel electrodes PE be made of a transparent conductive material such as ITO and IZO or a metal material, for example. The alignment film AL1 covers the pixel electrodes PE and the insulating film 14.

Meanwhile, the substrate SUB2 includes an insulating substrate 20 having optical transparency such as a glass substrate and a resin substrate. The substrate SUB2 also includes, over the insulating substrate 20 on a side thereof facing the substrate SUB1, the light shielding layer BM that is a light shielding film, color filters CFR, CFG, and CFB, an overcoating layer OCL, an alignment film AL2, and a conductive film CDF.

The conductive film CDF is disposed on a surface opposite to a surface facing the liquid crystal layer LQ among planes of the insulating substrate 20. The conductive film CDF, for example, is made of a transparent conductive material such as ITO or IZO. The conductive film CDF functions as a shield layer preventing an electromagnetic wave from the outside from affecting the liquid crystal layer LQ and the like. Also, in a case where a method of driving the liquid crystal layer LQ is the vertical electric field mode such as the TN mode and the VA mode, an electrode is provided to the substrate SUB2. This electrode also functions as a shield layer, whereby it is possible to omit the conductive film CDF.

The display device DSP1 includes an optical element OD1 and an optical element OD2. The optical element OD1 is disposed between the insulating substrate 10 and a backlight unit BL. The optical element OD2 is disposed above the insulating substrate 20, that is, disposed on an opposite side of the substrate SUB1 interposing the insulating substrate 20. Each of the optical element OD1 and the optical element OD2 includes at least a polarizer and may also include a wave plate as necessary.

<Planar Shape of Display Device and Circuit Layout>

Figure 7:
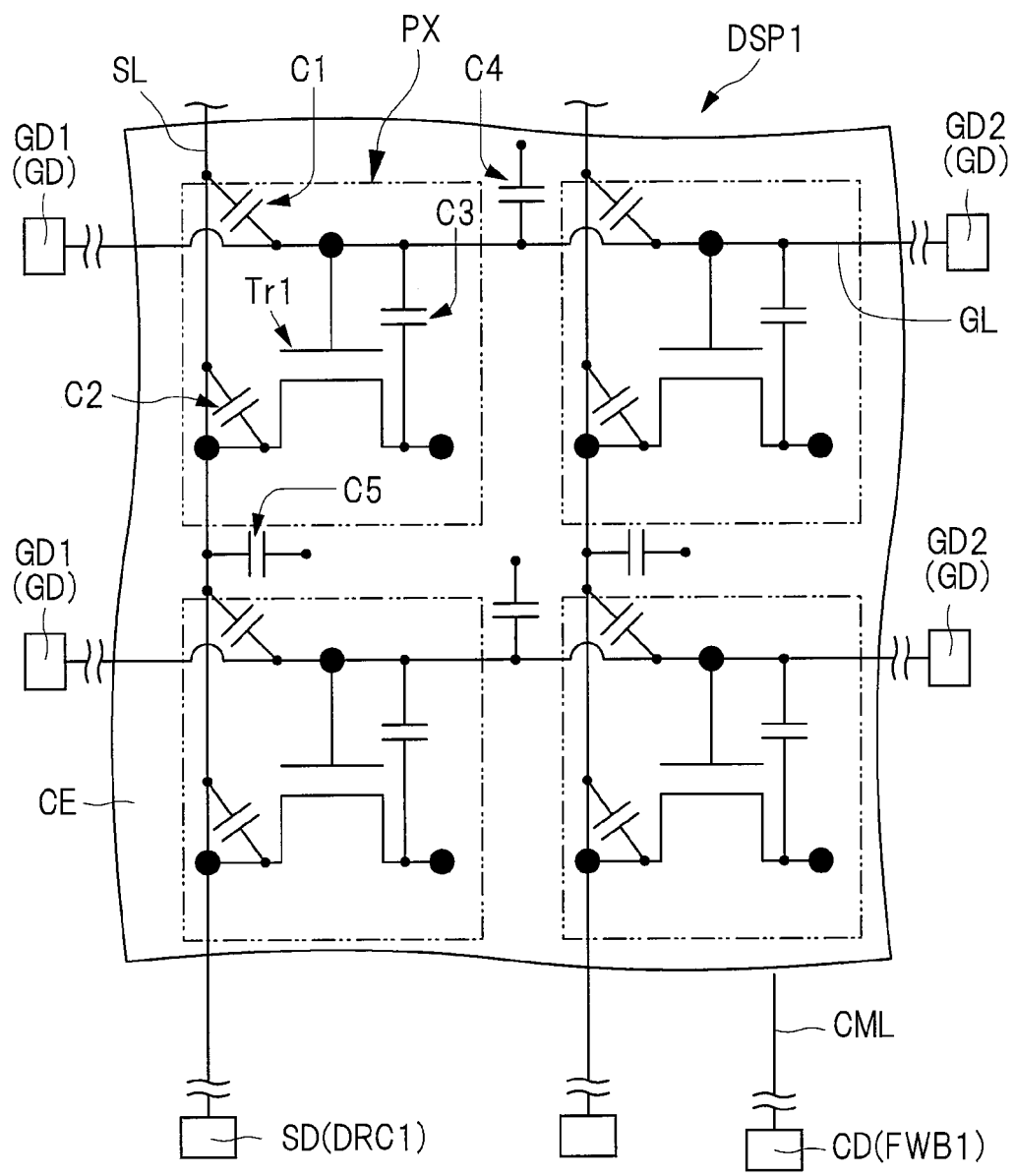
FIG. 7 is a circuit diagram schematically illustrating a factor of a load that is given to each of a plurality of pixels illustrated in FIG. 3.
Figure 8:
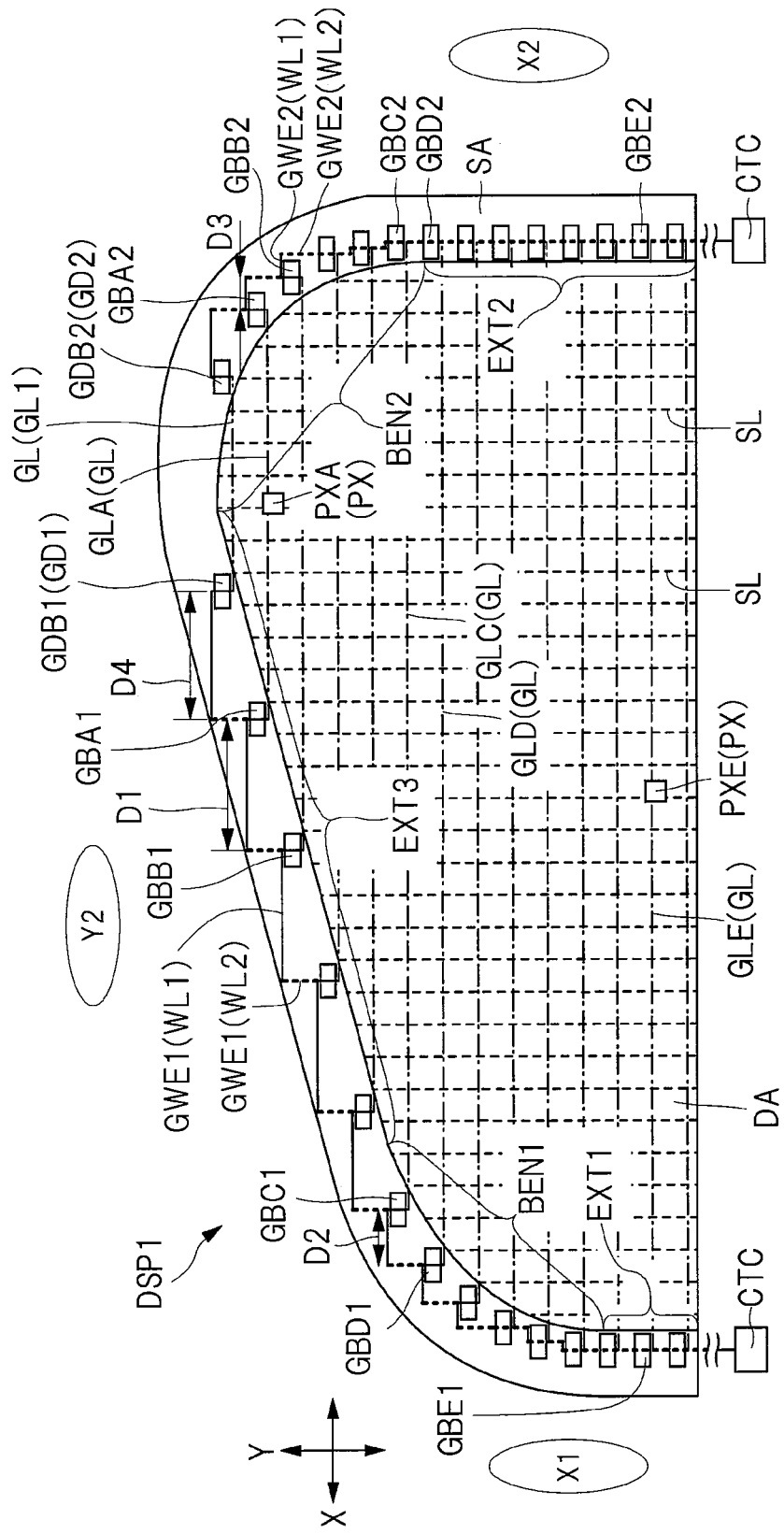
FIG. 8 is an enlarged plan view illustrating details of a circuit configuration of an upper side of the display device illustrated in FIG. 3.

Next, a relation between a planar shape of the display device and a circuit layout according to this embodiment will be described. FIG. 7 is a circuit diagram schematically illustrating a factor of a load that is given to each of a plurality of pixels illustrated in FIG. 3. Also, FIG. 8 is an enlarged plan view illustrating details of a circuit configuration of an upper side of the display device illustrated in FIG. 3.

Note that, in FIG. 7, to explicitly illustrate that the common electrode CE is disposed across the plurality of pixels PX, a sheet-like common electrode CE is illustrated. Also, in FIG. 8, to make the circuit layout of the driving circuits GD1 and GD2 easy to see, among the plurality of control wirings GW illustrated in FIG. 6, the enable line GWE transmitting an enable signal is representatively illustrated. Also, in FIG. 8, the circuit blocks GDB1 and GDB2 illustrated in FIG. 6 are indicated with rectangles. Each of the circuit blocks GBA1, GBB1, GBC1, GBD1, and GBE1 illustrated in FIG. 8 is included in a plurality of circuit blocks GDB1 constituting the driving circuit GD1. Further, each of the circuit blocks GBA2, GBB2, GBC2, GBD2, and GBE2 is included in a plurality of circuit blocks GDB2 constituting the driving circuit GD2. The circuit blocks GBA1 and GBA2, GBB1 and GBB2, GBC1 and GBC2, GBD1 and GBD2, and GBE1 and GBE2 are respectively connected to the same scanning signal lines GL. In FIG. 8, for viewability, each of the plurality of scanning signal lines GL is indicated with an alternate long and short dash line, and each of the plurality of video signal lines SL is indicated with a dotted line. Also, in FIG. 8, in each of the enable lines GWE1 and GWE2, a part formed in the wiring layer WL1 illustrated in FIG. 2 is indicated with a solid line, and a part formed in the wiring layer WL2 or the wiring layer WL3 is indicated with a dotted line. Also, in FIG. 8, among the plurality of pixels PX, one pixel PXA connected to a scanning signal line GLA and one pixel PXE connected to a scanning signal line GLE are schematically indicated with rectangles.

As illustrated in FIG. 1, in the display device DSP1 according to this embodiment, a planar shape of the display region DA and an external shape of the peripheral region SA are "irregular shapes." In the example illustrated in FIG. 1, the display device DSP1 is also used as a rearview mirror of a vehicle for checking rearward, and the planar shape of the display region DA and the external shape of the peripheral region SA are trapezoids. Also, in plan view, a shape of the light shielding layer BM disposed in the periphery of the display region DA is as follows. That is, the light shielding layer BM includes an extension portion (first extension portion) EXT1 and an extension portion (second extension portion) EXT2 each extending along the Y direction. Also, the light shielding layer BM has a bent portion (first bent portion) BEN1 and a bent portion (second bent portion) BEN2 between the extension portion EXT1 and the extension portion EXT2. Also, the extension portion EXT1 is connected to the bent portion BEN1, and the extension portion EXT2 is connected to the bent portion BEN2. Also, a length of the extension portion EXT2 is longer than a length of the extension portion EXT1. Also, in the example illustrated in FIG. 1, the light shielding layer BM has an extension portion (third extension portion) EXT3 between the bent portion BEN1 and the bent portion BEN2. The extension portion EXT3 has a side (inner edge side) extending along a direction T1 which is inclined relative to each of the Y direction and the X direction. Note that the direction which is inclined relative to the Y direction means a direction forming an angle other than a right angle or not in parallel to the Y direction. In the same way, the direction which is inclined relative to the X direction means a direction forming an angle other than the right angle or not in parallel to the X direction.

Note that the bent portion means a part where an extension direction changes. The bent portion includes a part where it is curved in a rounded manner in addition to a part where it is bent as illustrated in FIG. 1. In a case where it is curved in a rounded manner, a change amount (angle) of the extension direction of the curved part/total length of the curved part may be defined as a curvature.

Figure 17:
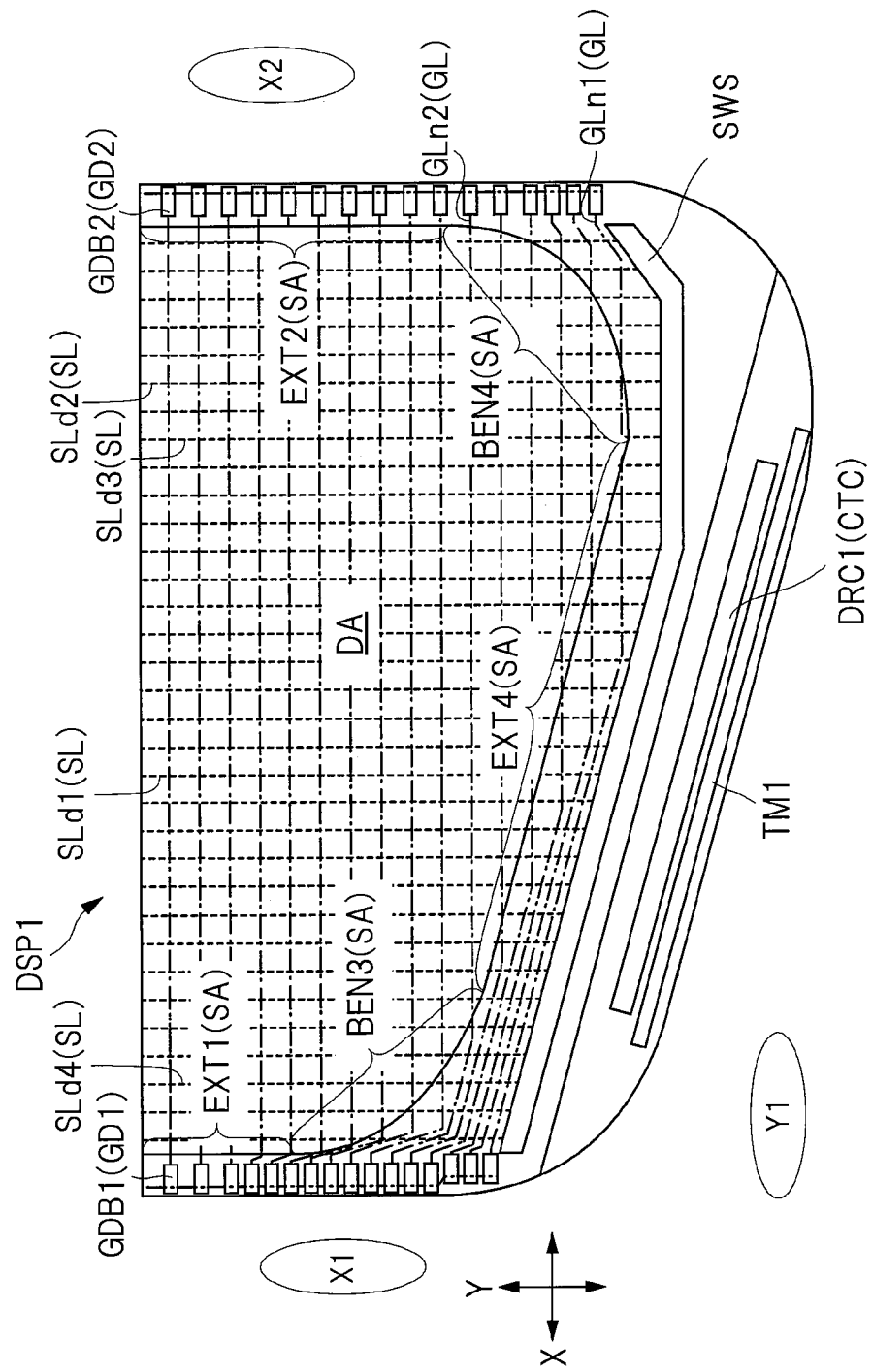
FIG. 17 is an enlarged plan view illustrating details of a circuit configuration of a lower side of the display device illustrated in FIG. 3.

Also, in the example illustrated in FIG. 1, the light shielding layer BM has the bent portion (third bent portion) BEN3 opposite to the bent portion BEN1 interposing the extension portion EXT1. Also, the light shielding layer BM has the bent portion (fourth bent portion) BEN4 opposite to the bent portion BEN2 interposing the extension portion EXT2. Also, the light shielding layer BM has the extension portion (fourth extension portion) EXT4 between the bent portion BEN3 and the bent portion BEN4, and the extension portion EXT4 has a side (inner edge side) extending along a direction T2 which is inclined relative to each of the Y direction and the X direction. In the example of this embodiment, the display region DA constitutes a trapezoid, whereby the direction T1 and the direction T2 are not in parallel to each other. Also, in the example illustrated in FIG. 1, the direction T2 and the direction T3 are in parallel to each other. The description "the direction T2 and the direction T3 are in parallel to each other" includes a case in which these directions are strictly in parallel in addition to a case in which, even though these directions are not strictly in parallel due to an influence of processing accuracy and the like, they are regarded as being substantially in parallel to each other. Note that, in FIG. 1, the bent portion BEN3 is described as the third bent portion and the bent portion BEN4 is described as the fourth bent portion so as to distinguish them from the bent portion BEN1 and the bent portion BEN2 on the Y2 side in the Y direction. Note that, as illustrated in FIG. 17 described below, focusing on the part on the Y1 side, it is possible to reword the bent portion BEN3 as the first bent portion and the bent portion BEN4 as the second bent portion. In the same way, the extension portion EXT4 is described as the fourth extension portion; however, it is also possible to reword it as the third extension portion.

From a viewpoint of improving quality of an image displayed on the display device DSP1, it is preferred that a value of a load (for example, an impedance value caused by parasitic capacitance, wiring resistance, and the like) given to each of the plurality of pixels PX arrayed in the display region DA be made even within a plane overlapping with the display region DA. Within the display region DA, when an in-plane distribution of the value of the load on the pixels PX becomes uneven, it may cause deterioration of image quality such as display unevenness.

A load factor given to each of the plurality of pixels PX includes a parasitic capacitance C1 to a parasitic capacitance C5 as well as wiring resistance of each of the scanning signal lines GL and wiring resistance of each of the video signal lines SL illustrated in FIG. 7. The parasitic capacitance C1 is parasitic capacitance between the scanning signal line GL and the video signal line SL. The parasitic capacitance C2 is parasitic capacitance between a source electrode and a drain electrode of the transistor Tr1, and the video signal line SL. The parasitic capacitance C3 is parasitic capacitance between the source electrode and the drain electrode of the transistor Tr1, and the scanning signal line GL. Also, the parasitic capacitance C4 is parasitic capacitance between the scanning signal line GL and the common electrode CE. The parasitic capacitance C5 is parasitic capacitance between the video signal line SL and the common electrode CE.

First, among the load factors given to each of the plurality of pixels PX, consideration is made by focusing mainly on a load caused by the wiring resistance of the scanning signal lines GL. As illustrated in FIG. 8, each of the plurality of scanning signal lines GL is disposed so as to traverse the display region DA along the X direction. In a case where a shape of the display region DA is not a square or a rectangle, some of the plurality of scanning signal lines GL may have a different length (extending distance). For example, in the example illustrated in FIG. 8, the scanning signal line GLA and the scanning signal line GLE differ from each other in length. Specifically, the scanning signal line GLA is connected to the circuit block GBA1 overlapping with the extension portion EXT3 and to the circuit block GBA2 overlapping with the bent portion BEN2. In other words, a part of the scanning signal line GLA overlaps with the extension portion EXT3, and the other part thereof overlaps with the bent portion BEN2. Also, the scanning signal line GLE is connected to the circuit block GBE1 overlapping with the extension portion EXT1 and to the circuit block GBE2 overlapping with the extension portion EXT2. In other words, a part of the scanning signal line GLE overlaps with the extension portion EXT1, and the other part thereof overlaps with the extension portion EXT2. In this case, a length (extending distance) of the scanning signal line GLE is longer than a length of the scanning signal line GLA.

Here, among the loads given to the pixel PXA located near the center of the scanning signal line GLA and the pixel PXE located near the center of the scanning signal line GLE illustrated in FIG. 8, the load caused by the wiring resistance of the scanning signal lines GL is as follows. That is, the wiring resistance of the scanning signal lines GL increases in proportion to a path distance from an end of the scanning signal lines GL to the gate electrode GE of the pixel PX (see FIG. 4). Also, as illustrated in FIG. 7, the wiring resistance of the scanning signal lines GL increases under an influence of the parasitic capacitance as the number of times the scanning signal lines GL cross the transistor Tr1 of each of the pixels and the video signal lines SL is increased. Accordingly, in order to improve display quality, it is preferred that a difference in time constant corresponding to each of the plurality of pixels PX be reduced.

Accordingly, in this embodiment, the load given to the plurality of pixels PX (see FIG. 8) is made even by adjusting the wiring resistance of the enable line GWE supplying a potential as a scanning signal Gsi (see FIG. 6) to the scanning signal line GL via the driving circuit GD illustrated in FIG. 6. Specifically, as described with reference to FIG. 2, the display device DSP1 includes the wiring layer (first wiring layer) WL1, and the wiring layer (second wiring layer) WL2 made of a material having resistivity lower than that of the wiring layer WL1. A conductor pattern formed in the wiring layer WL1 is made of, for example, metal such as chrome (Cr), titanium (Ti), and molybdenum (Mo), or an alloy thereof. The conductor pattern formed in the wiring layer WL2 is made of a metal film having a multilayer structure, for example, in which aluminum (Al) is sandwiched with molybdenum (Mo), titanium (Ti), or the like. In this case, resistivity (specific resistance) of the wiring layer WL1 is higher than specific resistance of the wiring layer WL2. As illustrated in FIG. 2, the scanning signal lines GL are formed in the wiring layer WL1. Then, the enable line (first potential supply line) GWE1 goes through the wiring layer WL1 and the wiring layer WL2 in a region overlapping with the extension portion EXT3.

Considering only from a viewpoint of reducing the wiring resistance of the enable line GWE1, it is preferred that the enable line GWE1 not go through the wiring layer WL1. For example, in a case where the enable line GWE1 goes through only the wiring layer WL2, it is possible to reduce the load that is given to the pixel PX caused by the wiring resistance of the enable line GWE1 to a substantially ignorable degree. However, in a case where a part of the enable line GWE1 goes through the wiring layer WL1, it is possible to adjust a value of the wiring resistance of the enable line GWE1 according to a wiring path distance of the part going through the wiring layer WL1. For example, in the example illustrated in FIG. 8, in a wiring path of the enable line GWE1 from the control circuit CTC to the circuit block GBA1, the enable line GWE1 goes through the wiring layer WL1 at a plurality of parts (a part indicated with a solid line extending in the X direction).

Here, a total value of the wiring path distance of the part going through the wiring layer WL1, of the enable line GWE1 supplying the potential to the scanning signal line GLA, for example, is longer than the wiring path distance of the part going through the wiring layer WL1, of the enable line GWE1 supplying the potential to the scanning signal line GLE. In this case, the wiring resistance of the enable line GWE1 supplying the potential to the scanning signal line GLA is larger than the wiring resistance of the enable line GWE1 supplying the potential to the scanning signal line GLE. Also, in a case where the part of the enable line GWE1 going through the wiring layer WL1, the wiring resistance of the enable line GWE1 is included in the load factor given to each of the pixel PXA and the pixel PXE. Then, with regard to the scanning signal Gsi for the pixel PXA and the pixel PXE, it is possible to reduce the difference in time constant by comprehensively considering influences of the wiring resistance of the scanning signal line GL, the wiring resistance of the enable wiring GWE1, and the parasitic capacitance C1. In other words, it is possible to reduce an in-plane difference of the time constant of each of the plurality of pixels PX arranged in the display region DA. That is, according to this embodiment, by adjusting the wiring resistance of the enable wiring GWE1, variation in in-plane distribution of the load caused by the wiring resistance of the scanning signal lines GL and by the parasitic capacitance C1 is reduced. As a result, it is possible to improve the quality of an image displayed on the display device DSP1.

Also, the driving circuit GD1 includes the circuit block (first A circuit block) GBA1, the circuit block (first B circuit block) GBB1, the circuit block (first C circuit block) GBC1, and the circuit block (first D circuit block) GBD1. In the example illustrated in FIG. 8, the circuit block GBA1 and the circuit block GBB1 overlap with the extension portion EXT3, and the circuit block GBC1 and the circuit block GBD1 overlap with the bent portion BEN1. The enable line GWE1 goes through the wiring layer WL1 between the circuit block GBA1 and the circuit block GBB1 at a distance (first distance) D1. Also, the enable line GWE1 goes through the wiring layer WL1 between the circuit block GBC1 and the circuit block GBD1 at a distance (first distance) D2. The distance D2 is shorter than the distance D1.

In the example illustrated in FIG. 8, the enable line GWE1 goes through the wiring layer WL1 between the circuit block GDB1, which is at a terminal end of the driving circuit GD1, and the circuit block GBA1 adjacent thereto at a distance D4. In the example illustrated in FIG. 8, the distance D4 is shorter than the distance D1. However, since a length of the distance D4 is determined according to a space of the extension portion EXT3, the distance D4 may be the same as the distance D1 in some cases.

Also, the driving circuit GD2 includes a circuit block (second A circuit block) GBA2 and a circuit block (second B circuit block) GBB2. In the example illustrated in FIG. 8, the circuit block GBA2 and the circuit block GBB2 overlap with the bent portion BEN2. The enable line GWE2 goes through the wiring layer WL1 between the circuit block GBA2 and the circuit block GBB2 at a distance (third distance) D3. The distance D1 is longer than the distance D3.

Each of the plurality of scanning signal lines GL extends along the X direction. Accordingly, when, among the enable lines GWE1 and GWE2, a part formed in the wiring layer WL1 extends along the X direction, it is easy to make resistance values of the plurality of signal transmission paths (wiring path distance including the enable line GWE and the scanning signal line GL) even. A length of the extension portion EXT3 in the X direction is longer than a length of the bent portion BEN1 or length of the bent portion BEN2 in the X direction. Thus, in the region overlapping with the extension portion EXT3, compared to a region overlapping with the bent portion BEN1 or BEN2, it is possible to make a wiring length in the X direction longer. Thus, as illustrated in FIG. 8, in a case where the distance D1 is longer than the distance D2 or the distance D3, it is easy to make the resistance values of the plurality of signal transmission paths even.

Also, in the example illustrated in FIG. 8, in the region overlapping with the bent portion BEN2, the enable line (second potential supply line) GWE2 goes through the wiring layer WL1 and the wiring layer WL2. In this case, by adjusting the wiring resistance of the enable wiring GWE2, it is possible to reduce the variation in in-plane distribution of the load caused by the wiring resistance of the scanning signal lines GL and the parasitic capacitance C1. However, since the extension portion EXT3 has a larger area than the bent portion BEN2, it is possible to make a distance at which the enable line GWE2 goes through the wiring layer WL1 longer. Accordingly, an effect of preventing variation in time constant due to the part of the enable line going through the wiring layer WL1 is relatively higher in the enable line GWE1. However, in a case where each of the enable line GWE1 and the enable line GWE2 goes through both of the wiring layer WL1 and the wiring layer WL2, the effect of preventing variation in time constant is especially high.

Also, as in this embodiment, from a viewpoint of reducing an in-plane difference of the load given to the plurality of pixels PX, for a part connected to the scanning signal line GL having the relatively low wiring resistance, it may be preferred that the part of the enable line GWE1 or GWE2 not go through the wiring layer WL1, in some cases. For example, in the example illustrated in FIG. 8, in a region overlapping with the extension portion EXT1, the enable line GWE1 goes through the wiring layer WL2 and does not go through the wiring layer WL1. Also, in a region overlapping with the extension portion EXT2, the enable line GWE2 goes through the wiring layer WL2 and does not go through the wiring layer WL1. A length of each of the plurality of scanning signal lines GL connecting the extension portion EXT1 to the extension portion EXT2 is designed to be the same (although there may be a small difference due to processing accuracy and the like). The length of each of the plurality of scanning signal lines GL connecting the extension portion EXT1 to the extension portion EXT2 is the longest among the plurality of scanning signal lines GL provided in the display device DSP1. For example, like the scanning signal line GLE, the length of each of the plurality of scanning signal lines GL having one end overlapping with the extension portion EXT1 and the other end overlapping with the extension portion EXT2 is longer than the length of the scanning signal line GL (for example, the scanning signal line GLA) having one end overlapping with the extension portion EXT3. That is, the wiring resistance of the scanning signal line GLE is larger than the wiring resistance of the scanning signal line GLA. Thus, in the regions overlapping with the extension portions EXT1 and EXT2, even when the wiring resistance of the path (enable lines GWE1 and GWE2) for supplying a potential is increased, it is not possible to obtain an effect of reducing the in-plane difference of the time constant. Also, when the wiring resistance of the enable lines GWE1 and GWE2 as a whole is large, the load given to each of the plurality of pixels PX becomes large. Thus, from a viewpoint of increasing adjusting margin of the wiring resistance of the enable lines GWE1 and GWE2, it is preferred that the enable lines GWE1 and GWE2 not go through the wiring layer WL1 in the region overlapping with the extension portion EXT1 and in the region overlapping with the extension portion EXT2.

Also, the driving circuit GD2 includes the circuit block (second C circuit block) GBC2 and the circuit block (second D circuit block) GBD2. The circuit block GBC1 and the circuit block GBC2 are connected to the same scanning signal line GLC. Also, the circuit block GBD1 and the circuit block GBD2 are connected to the same scanning signal line GLD. Here, the enable line GWE1 goes through the wiring layer WL1 and the wiring layer WL2 between the circuit block GBC1 and the circuit block GBD1. Meanwhile, the enable line GWE2 goes through the wiring layer WL2 and does not go through the wiring layer WL1, between the circuit block GBC2 and the circuit block GBD2. In the example illustrated in FIG. 8, the circuit block GBC2 overlaps with the bent portion BEN2, and the circuit block GBD2 overlaps with the extension portion EXT2. The circuit block GBC2 is disposed in the vicinity of the extension portion EXT2 and is disposed on an extended line of an arrangement line of the plurality of circuit blocks GDB2 disposed in a position to overlap the extension portion EXT2. In this case, as long as the enable line GWE1 goes through the wiring layer WL1 and the wiring layer WL2 between the circuit block GBC1 and the circuit block GBD1, it is possible to adjust the load given to the pixels PX even when the enable line GWE2 does not go through the wiring layer WL1.

Also, the part of the enable line GWE1 overlaps with the extension portion EXT1. In the region overlapping with the extension portion EXT1, the enable line GWE1 goes through the wiring layer WL2 and does not go through the wiring layer WL1. Accordingly, for example, it is possible to reduce the load given to the pixel PXE connected to the scanning signal line GLE.

However, even in a case where the part of the enable line GWE1 goes through the wiring layer WL1 in the region overlapping with the extension portion EXT1 and even in a case where the part of the enable line GWE2 goes through the wiring layer WL1 in the region overlapping with the extension portion EXT2, it is not possible to make the distance at which the enable lines GWE1 and GWE2 go through the wiring layer WL1 longer due to a limitation on space. Thus, as a modification of FIG. 8, in the region overlapping with the extension portion EXT1 and in the region overlapping with the extension portion EXT2, the respective parts of the enable lines GWE1 and GWE2 may go through the wiring layer WL1.

Also, in this embodiment, a driving circuit is connected to either end of each of the plurality of scanning signal lines GL. In other words, each of the plurality of scanning signal lines GL is driven by the both-side driving method. In this way, in a case where the plurality of scanning signal lines GL are driven by the both-side driving method, when a part of the plurality of scanning signal lines GL is driven by the one-side driving method, it may be a cause of making the in-plane distribution of the load given to the plurality of scanning signal lines GL uneven. That is, from a viewpoint of improving the image quality, it is preferred that all of the scanning signal lines GL be driven by the both-side driving method.

Supposedly, when the planar shape of the display region DA is a square or a rectangle, it is easy to make each length of the plurality of scanning signal lines GL even and to make each length of the plurality of video signal lines SL even. Accordingly, it is relatively easy to set the value of the load given to each of the plurality of pixels PX arrayed so as to overlap with the display region DA, to be substantially constant. However, as in this embodiment, in the display device DSP1 having the display region DA of an irregular shape, the in-plane distribution of the value of the load given to each of the plurality of pixels PX may easily become uneven.

Thus, in a case of the display device DSP1 according to this embodiment, as illustrated in FIG. 3, the driving circuit GD1 extends to the vicinity of the bent portion BEN2 (see FIG. 2) across a region overlapping with the bent portion BEN1 (see FIG. 1). In other words, in plan view, the bent portion BEN2 is located between a termination portion of the driving circuit GD1 and a termination portion of the driving circuit GD2. Accordingly, the driving circuits GD are connected to both ends of the scanning signal line GL1 which is arrayed the closest to the Y2 side in the Y direction among the plurality of scanning signal lines GL. In other words, each of the plurality of scanning signal lines GL including the scanning signal line GL1 is driven by the both-side driving method. Accordingly, it is possible to prevent deterioration of image quality caused by a part of the plurality of scanning signal lines GL being driven by the one-side driving method.

Figure 9:
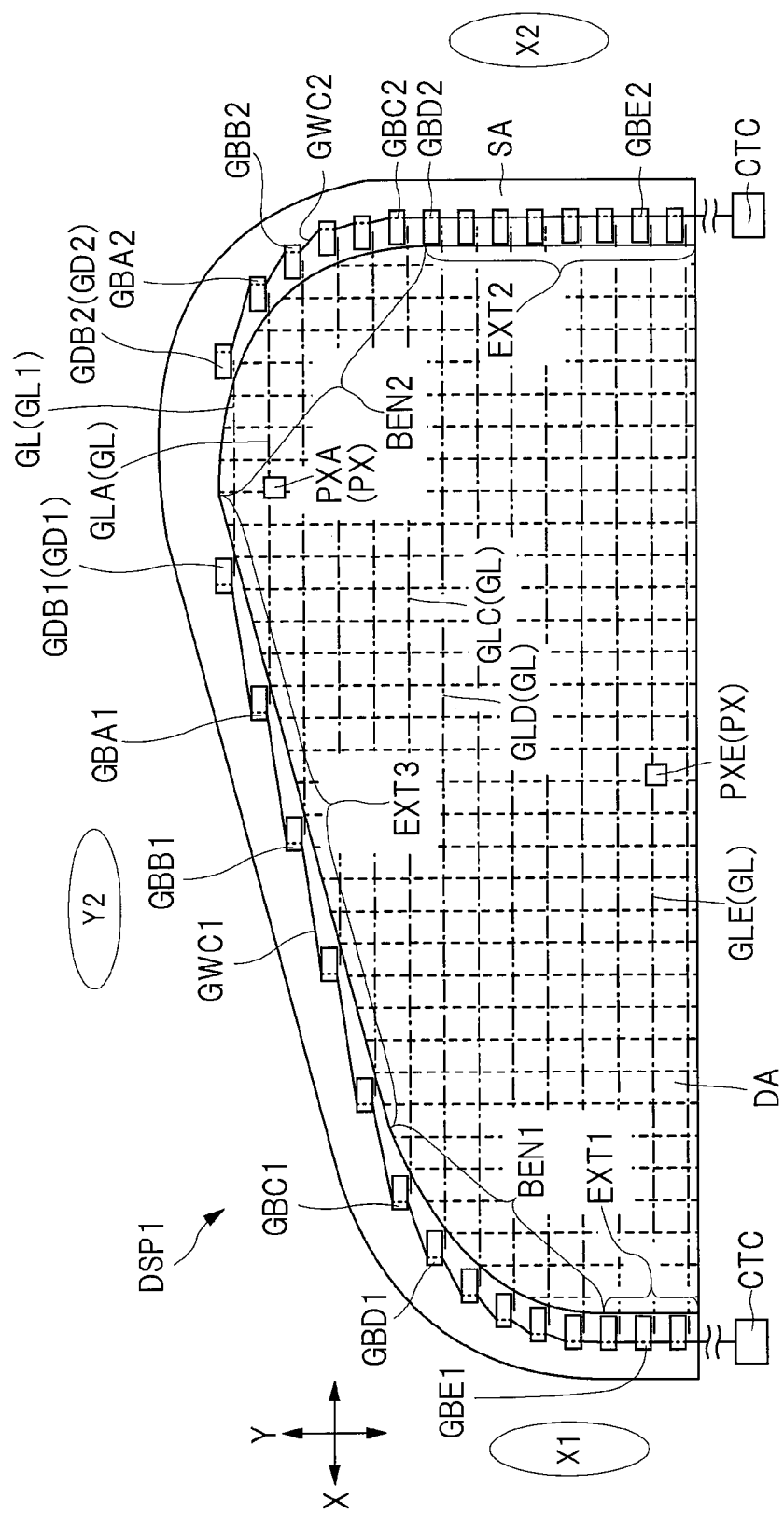
FIG. 9 is an enlarged plan view illustrating an exemplary layout of wirings supplying a clock signal to a driving circuit in the same part as the display device illustrated in FIG. 8.

The above-described configuration may also be described in the following by using clock lines GWC1 and GWC2 illustrated in FIG. 9. FIG. 9 is an enlarged plan view illustrating an exemplary layout of wirings supplying a clock signal to the driving circuit in the same part as the display device illustrated in FIG. 8. In FIG. 9, for easy understanding of a circuit layout of the driving circuits GD1 and GD2, among the plurality of control wirings GW illustrated in FIG. 6, the clock line GWC transmitting the clock signal is representatively illustrated.

As illustrated in FIG. 9, that is, the display device DSP1 includes the clock line (first clock line) GWC1 connecting the control circuit CTC to the driving circuit GD1 and in which a clock signal (first clock signal) GCL1 (see FIG. 6) is supplied, and the clock line (second clock line) GWC2 connecting the control circuit CTC to the driving circuit GD1 and in which a clock signal (second clock signal) GCL2 (see FIG. 6) is supplied. Also, in plan view, the bent portion BEN1 overlaps with the clock line GWC1, and the bent portion BEN2 is located between a termination portion of the clock line GWC1 and a termination portion of the clock line GWC2. As illustrated in FIG. 9, the termination portion of the clock line GWC1 is located between the bent portion BEN1 and the bent portion BEN2. In the example illustrated in FIG. 9, the termination portion of the clock line GWC2 overlaps with the bent portion BEN2 while the termination portion of the clock line GWC1 does not overlap with the bent portion BEN2. To one of oblique sides of the display device DSP1 having a trapezoidal planar shape, or a side along the extension portion EXT3 illustrated in FIG. 9, it is possible to dispose the driving circuit GD1 along the oblique side. Accordingly, it is possible to apply the both-side driving method of the scanning signal line GL up to the termination portion of the driving circuit GD1 and the termination portion of the driving circuit GD2, in other words, to the termination portion of the clock line GWC1 and the termination portion of the clock line GWC2.

Figure 10:
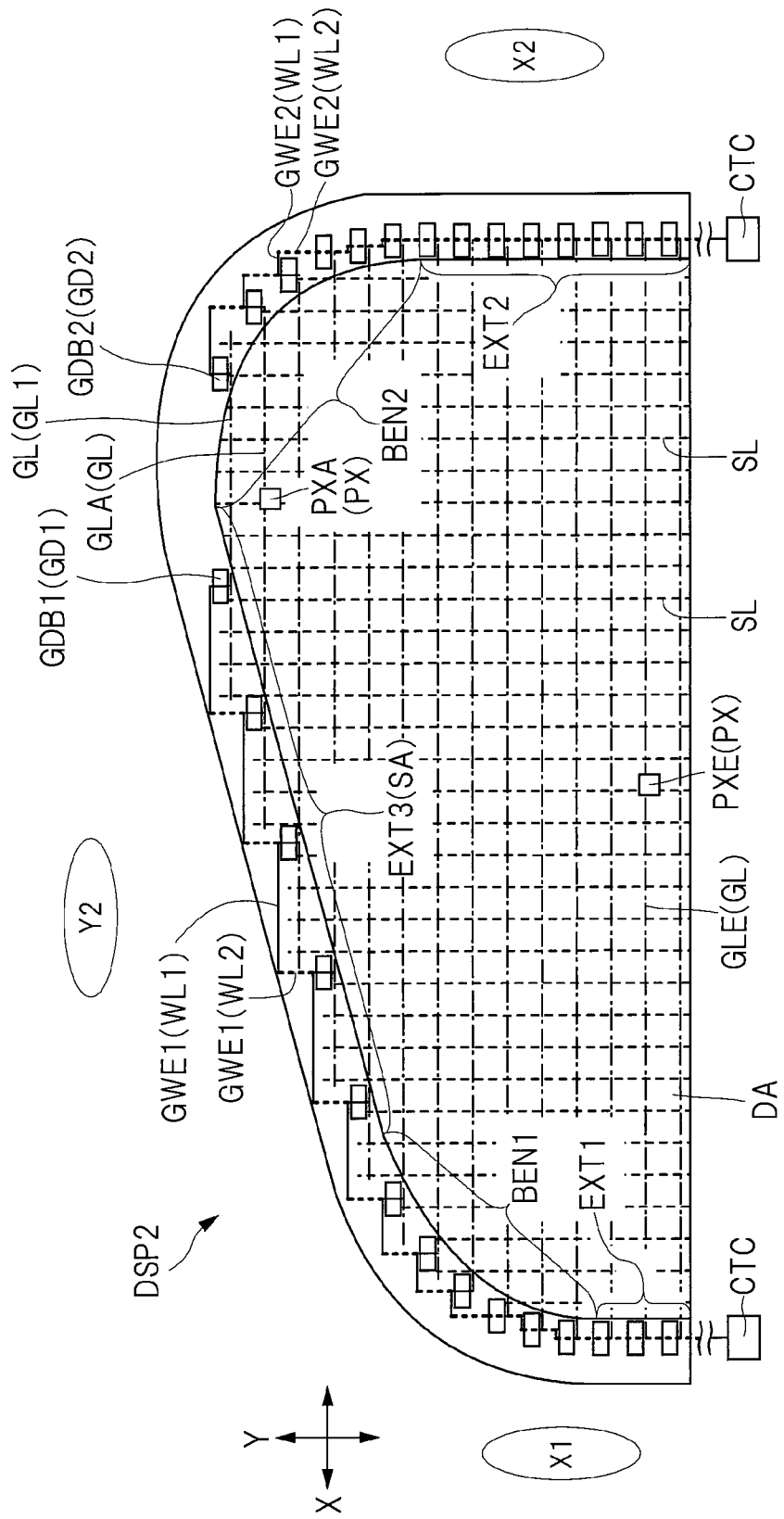
FIG. 10 is an enlarged plan view of a display device that is a modification of FIG. 8.
Figure 11:
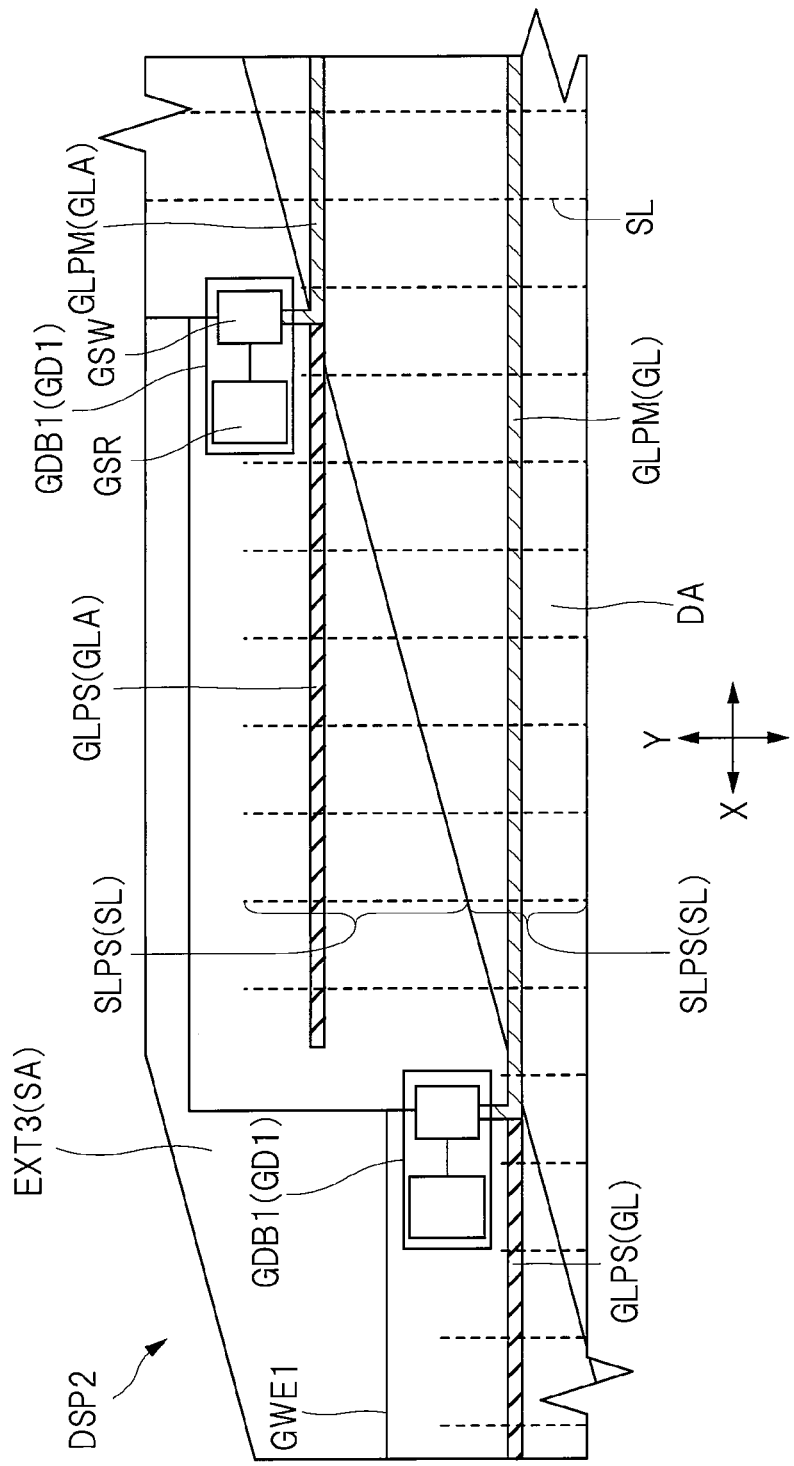
FIG. 11 is an enlarged plan view illustrating a circuit layout around a circuit block illustrated in FIG. 10.
Figure 12:
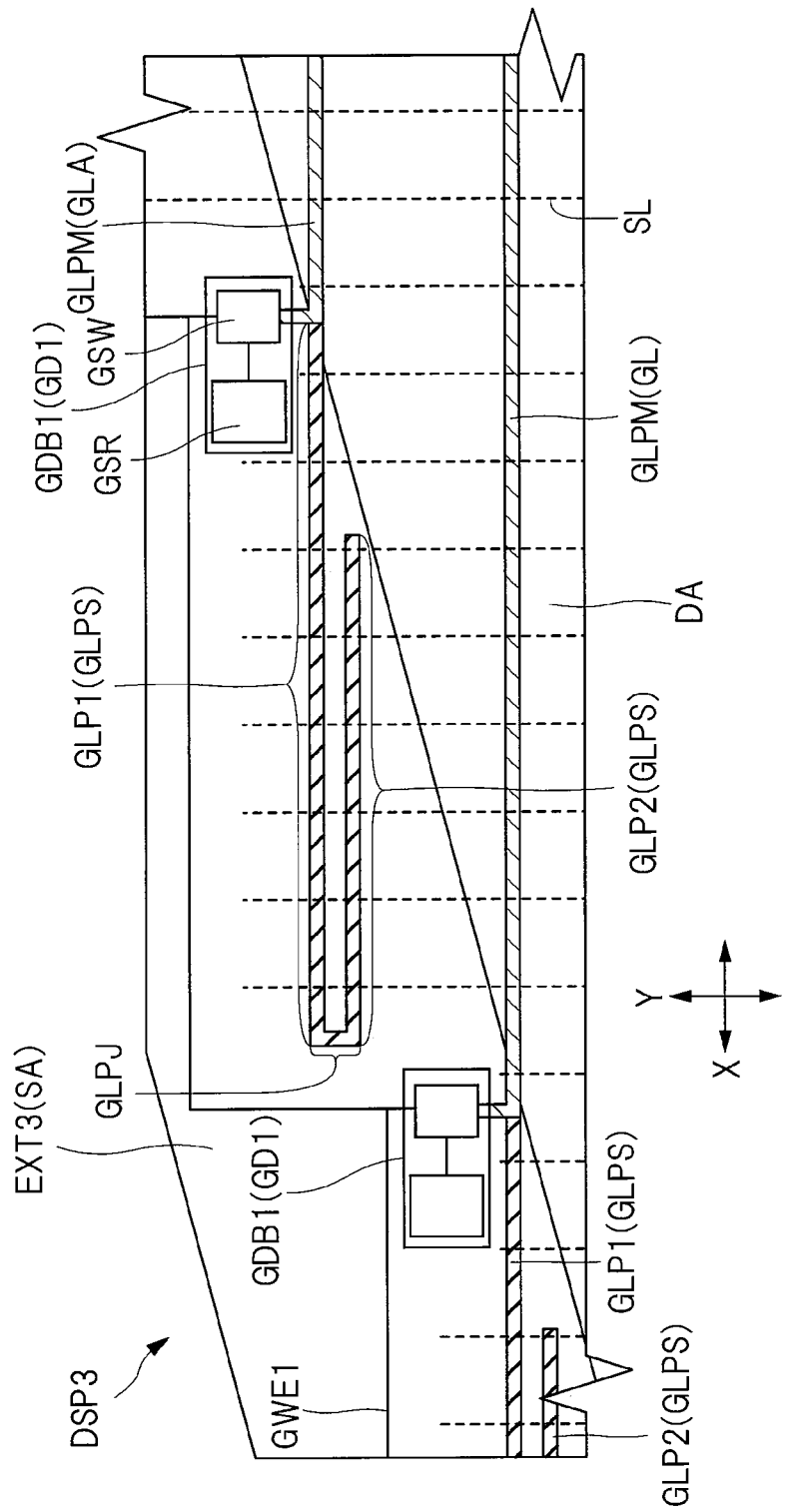
FIG. 12 is an enlarged plan view illustrating a modification of FIG. 11.

Next, among the load factors given to each of the plurality of pixels PX illustrated in FIG. 7, a load caused by the parasitic capacitance C1 (see FIG. 7) between the scanning signal line GL and the video signal line SL will be considered. FIG. 10 is an enlarged plan view of a display device that is a modification of FIG. 8. Also, FIG. 11 is an enlarged plan view illustrating a circuit layout around the circuit block illustrated in FIG. 10. Also, FIG. 12 is an enlarged plan view illustrating a modification of FIG. 11. In FIGS. 11 and 12, the scanning signal lines GL are indicated with hatching in order to identify a boundary between a wiring portion (main wiring portion) GLPM and a wiring portion (sub-wiring portion) GLPS of each of the scanning signal lines GL. Although the wiring portion GLPM and the wiring portion GLPS are indicated with the hatching of different types, the wiring portion GLPM and the wiring portion GLPS are conductor patterns that are formed of the same conductive material to be continuous to the wiring layer WL1 (see FIG. 2).

In a case where the shape of the display region DA is not a square or a rectangle, some of the plurality of scanning signal lines GL differ from others in the number of the video signal lines SL crossed thereby. For example, in the example illustrated in FIG. 8, in plan view, the number of the video signal lines SL crossed by the scanning signal line GLA within the display region DA is different from the number of the video signal lines SL crossed by the scanning signal line GLE within the display region DA.

Specifically, the number of the video signal lines SL crossed by the scanning signal line GLA is smaller than the number of the video signal lines SL crossed by the scanning signal line GLE within the display region DA. In other words, the number of the parasitic capacitances C1 (see FIG. 7) connected to a signal transmission path for transmitting the scanning signal Gsi (see FIG. 6) to the pixel PXE illustrated in FIG. 8 is larger than the number of the parasitic capacitances C1 connected to a signal transmission path for transmitting the scanning signal Gsi to the pixel PXA. Thus, when only the parasitic capacitances C1 illustrated in FIG. 7 are simply considered, the load given to the pixel PXE is larger than the load given to the pixel PXA. Then, in order to improve the display quality, it is preferred that the in-plane difference of the load given to each of the plurality of pixels PX be reduced as described above.

Accordingly, in a display device DSP2 illustrated in FIG. 10, a part of the plurality of video signal lines SL is extended to the region overlapping with the extension portion EXT3 of the peripheral region SA across the display region DA. Then, in the extension portion EXT3, the scanning signal lines GL and the video signal lines SL cross each other. In this case, the number of the video signal lines SL crossed by one scanning signal line GL (for example, the scanning signal line GLA) overlapping with the extension portion EXT3 becomes larger than that in the display device DSP1 illustrated in FIG. 8. That is, among the loads given to the pixel PXA connected to the scanning signal line GLA, the load corresponding to the parasitic capacitance C1 illustrated in FIG. 7 increases. Accordingly, it is possible to reduce the in-plane difference of the load given to each of the plurality of pixels PX.

Specifically, as illustrated in FIG. 11, in plan view, the scanning signal line GLA includes the wiring portion (main wiring portion) GLPM located between the driving circuit (first driving circuit) GD1 and the display region DA and within the display region DA, and the wiring portion (sub-wiring portion) GLPS connected to the wiring portion GLPM and located between the driving circuit GD1 and an outer edge of the peripheral region SA. In plan view, the wiring portion GLPS crosses the video signal lines SL. The wiring portion GLPS is on an extended line of the wiring portion GLPM and extends along the X direction. In the example illustrated in FIG. 11, each of the plurality of scanning signal lines GL includes the wiring portion GLPM and the wiring portion GLPS. Also, each of the plurality of video signal lines SL includes a wiring portion (main wiring portion) SLPM within the display region DA in plan view and a wiring portion (sub-wiring portion) SLPS in the peripheral region SA in plan view. Then, in the peripheral region SA, or more specifically, in the region overlapping with the extension portion EXT3, the wiring portion GLPS of each of the scanning signal lines GL crosses the wiring portion SLPS of each of the plurality of video signal lines SL.

In the peripheral region SA, the parasitic capacitance C1 (see FIG. 7) is given to a part where the scanning signal line GLA crosses each of the plurality of video signal lines SL. Each of the parasitic capacitances C1 at a plurality of crossing parts is included in the load given to the pixel PXA (see FIG. 10) connected to the scanning signal line GLA. As a result, it is possible to reduce a difference between the load given to the pixel PXE and the load given to the pixel PXA illustrated in FIG. 10.

Also, in the example illustrated in FIG. 10, the plurality of scanning signal lines GL including the scanning signal line GLA cross the video signal lines SL in the region overlapping with the bent portion BEN2. In this case, it is possible to further increase the number of the video signal lines SL crossed by the scanning signal line GLA in the peripheral region. However, on an extended line of the scanning signal line GLA, a length of the region overlapping with the extension portion EXT3 is longer than a length of the region overlapping with the bent portion BEN2. Accordingly, the number of the video signal lines SL crossed by the scanning signal line GLA is larger in the region overlapping with the extension portion EXT3 than in the region overlapping with the bent portion BEN2.

Meanwhile, as in the display device DSP2, in a case where the wiring portion GLPS of the scanning signal lines GL and the wiring portion SLPS of the video signal lines SL are disposed in the peripheral region SA, depending on a layout of the control wirings GW (see FIG. 6) disposed in the peripheral region SA, there may also be a case in which the control wiring GW crosses the scanning signal line GL or the control wiring GW crosses the video signal line SL. However, it is preferred that neither the scanning signal line GL nor the video signal line SL cross the control wiring GW in plan view. For example, in the example illustrated in FIG. 11, the wiring portion GLPS of the scanning signal lines GL does not cross the enable line GWE1 in plan view. Also, the wiring portion SLPS of the video signal line SL does not cross the enable line GWE1 in plan view. Although not illustrated in FIG. 11, it is preferred that each of the clock line GWC and the start pulse line GWS illustrated in FIG. 6 not cross the scanning signal line GL and the video signal line SL in the peripheral region SA.

Also, as illustrated in FIG. 10, some of the plurality of scanning signal lines GL do not have the wiring portion GLPS (see FIG. 11). For example, the scanning signal line GLE illustrated in FIG. 10 does not have the wiring portion GLPS. In plan view, the number of the video signal lines SL crossed by the scanning signal line GLA within the display region DA is smaller than the number of the video signal lines SL crossed by the scanning signal line GLE. In the case of the display device DSP2, among the plurality of scanning signal lines GL, the wiring portion GLPS is selectively provided to the scanning signal line GL that crosses the relatively small number of the video signal lines SL. In particular, the scanning signal line GLE has one end overlapping with the extension portion EXT1 and the other end overlapping with the extension portion EXT2. Accordingly, the number of the video signal lines SL crossed by the scanning signal line GLE within the display region DA is larger than the number thereof crossed by another of the scanning signal lines GL. From a viewpoint of reducing the in-plane difference of the load given to the plurality of pixels PX, it is preferred that the wiring portion GLPS not be provided to the scanning signal line GL having the maximum number of the video signal lines SL crossed thereby within the display region DA, like the scanning signal line GLE.

The display device DSP2 illustrated in FIGS. 10 and 11 is similar to the display device DSP1 illustrated in FIG. 8 except that the video signal lines SL cross the scanning signal lines in the peripheral region SA. Accordingly, regarding a part common to the display device DSP1 and the display device DSP2, a repeated description thereof is omitted.

Also, as in a display device DSP3 illustrated in FIG. 12, in a case where one scanning signal line GL crosses one video signal line SL at multiple places in the peripheral region SA, it is possible to further increase the number of the parasitic capacitances C1 given to the one scanning signal line GL. In the display device DSP3, a shape of the wiring portion GLPS is different from that in the display device DSP2 illustrated in FIG. 11. In the display device DSP3, the wiring portion GLPS of the scanning signal lines GL (including at least the scanning signal line GLA) includes a wiring portion (first wiring portion) GLP1 connected to the wiring portion GLPM, and a wiring portion (second wiring portion) GLP2 connected to the wiring portion GLPS and extending in a position different from the wiring portion GLP1. The wiring portion GLP1 is on the extended line of the wiring portion GLPM and extends along the X direction. One end of the wiring portion GLP1 is connected to the wiring portion GLPM. The other end of the wiring portion GLP1 is connected to the wiring portion GLP2 via a wiring portion GLPJ extending along the Y direction. Also, the wiring portion GLP2 is not on the extended line of the wiring portion GLPM and extends along the X direction. Each of the wiring portion GLP1 and the wiring portion GLP2 crosses the plurality of video signal lines SL in the peripheral region SA (more specifically, in the region overlapping with the extension portion EXT3). In other words, at least a part of the plurality of video signal lines SL illustrated in FIG. 12 crosses the wiring portion GLPS at multiple places. In the exemplary scanning signal line GLA illustrated in FIG. 12, each of the six video signal lines SL crosses the wiring portion GLP1 and the wiring portion GLP2 of the wiring portion GLPS.

In the display device DSP3, the number of the video signal lines SL crossed by the scanning signal line GLA in the peripheral region SA is the same as the number thereof in the display device DSP2 illustrated in FIG. 11. However, the scanning signal line GLA crosses the video signal lines SL at more places in the display device DSP3 than in the display device DSP2. In the example illustrated in FIG. 12, the scanning signal line GLA crosses each of the plurality of video signal lines SL at two places. In this case, compared to the display device DSP2, it is possible to increase the number of the parasitic capacitances C1 (see FIG. 7) given to the scanning signal line GLA in the display device DSP3.

Note that, in FIG. 12, as an example in which one scanning signal line GL crosses one video signal line SL at multiple places in the peripheral region SA, there is exemplified an aspect in which crossing occurs at two places; however, the "multiple places" may also be three or more places.

Also, in the example illustrated in FIG. 12, a length (length in the X direction) of the wiring portion GLP2 is shorter than a length (length in the X direction) of the wiring portion GLP1. Accordingly, some of the plurality of video signal lines SL crossing the wiring portion GLP1 may not cross the wiring portion GLP2. In the exemplary scanning signal lines GLA illustrated in FIG. 12, each of the two video signal lines SL crosses the wiring portion GLP1 and does not cross the wiring portion GLP2. According to this embodiment, it is possible to mitigate a difference in the wiring resistance between the scanning signal lines GL.

The display device DSP3 illustrated in FIG. 12 is similar to the display device DSP2 illustrated in FIG. 11 except for the difference described above. For example, similar to the display device DSP2 illustrated in FIG. 10, also in the display device DSP3, a part of the plurality of scanning signal lines GL (for example, the scanning signal line GLE) does not have the wiring portion GLPS. Regarding a part common to the display device DSP3 and the display device DSP2, a repeated description thereof is omitted.

Figure 13:
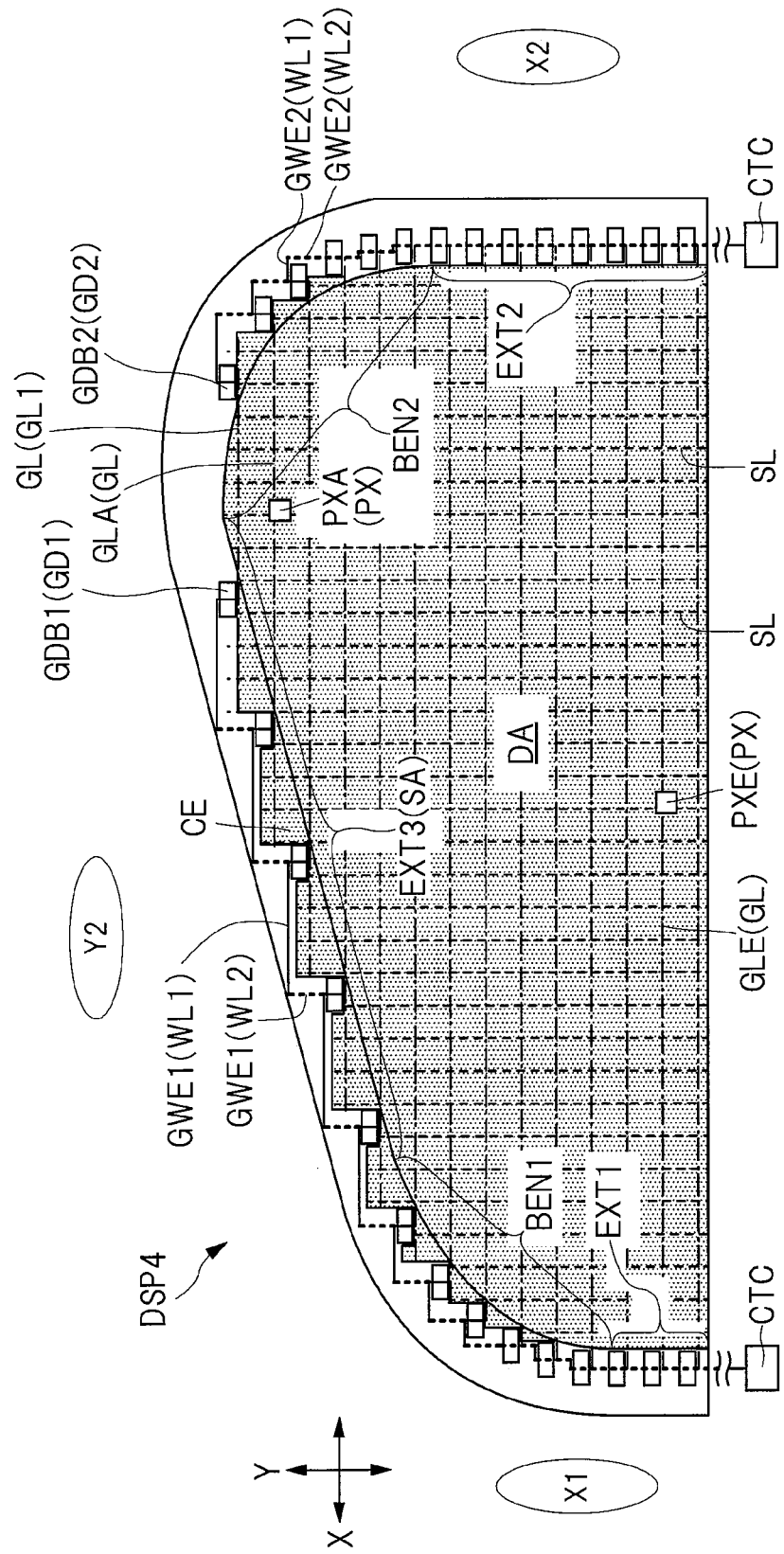
FIG. 13 is an enlarged plan view of a display device that is another modification of FIG. 10.
Figure 14:
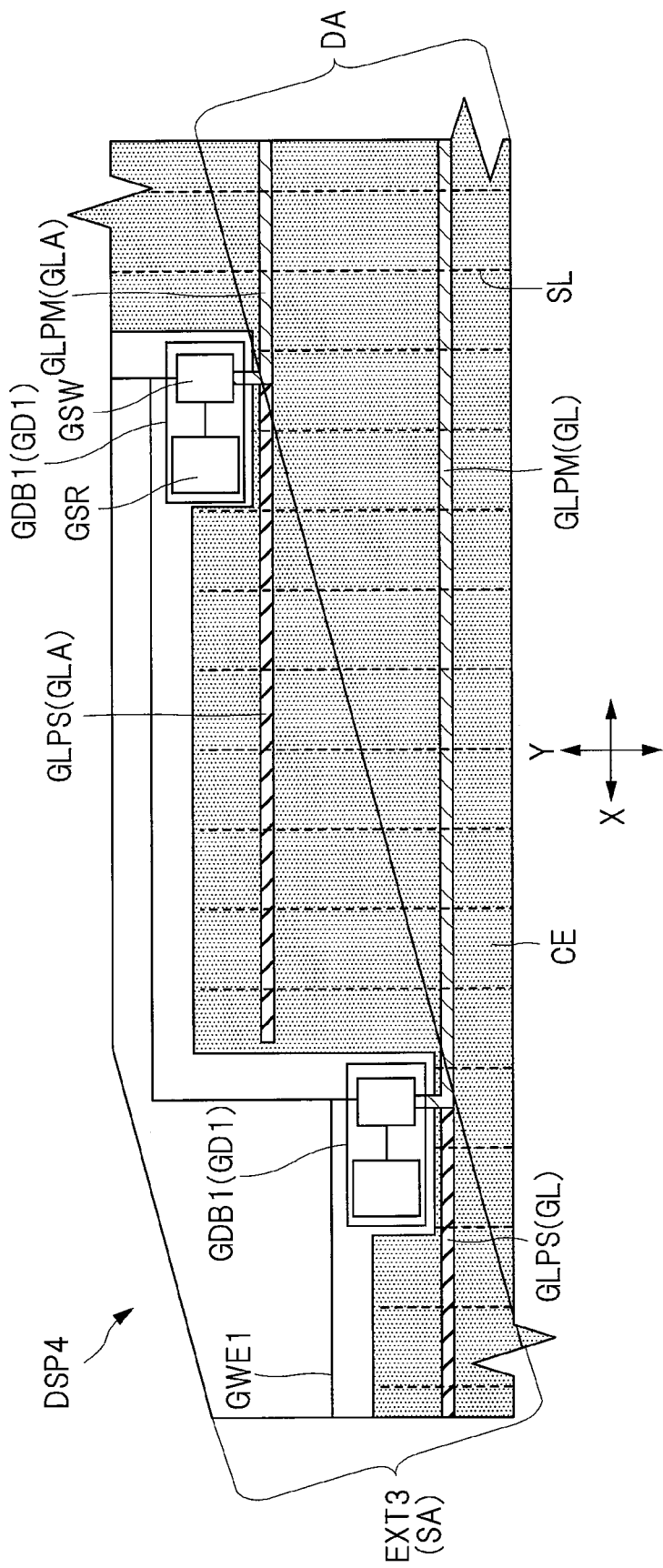
FIG. 14 is an enlarged plan view illustrating a circuit layout around a circuit block illustrated in FIG. 13.
Figure 15:
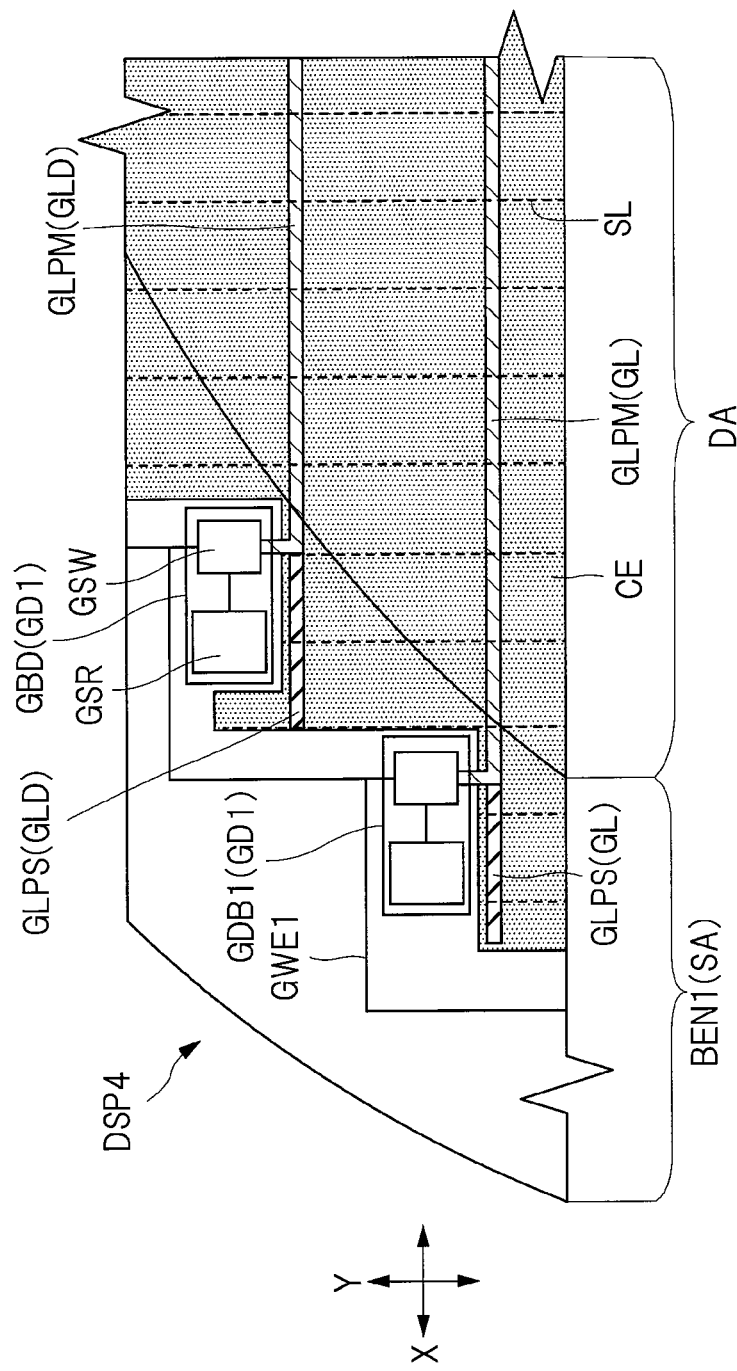
FIG. 15 is an enlarged plan view illustrating a circuit layout around another circuit block different from the circuit block illustrated in FIG. 14, among a plurality of circuit blocks illustrated in FIG. 13.

Next, among the load factors given to each of the plurality of pixels PX illustrated in FIG. 7, a load caused by the parasitic capacitance C4, which is a parasitic capacitance between the scanning signal line GL and the common electrode CE, will be considered. FIG. 13 is an enlarged plan view of a display device that is another modification of FIG. 10. Also, FIG. 14 is an enlarged plan view illustrating a circuit layout around a circuit block illustrated in FIG. 13. FIG. 15 is an enlarged plan view illustrating a circuit layout around a circuit block that is different from the circuit block illustrated in FIG. 14 among the plurality of circuit blocks illustrated in FIG. 13. In FIGS. 13 to 15, a region overlapping with the common electrode CE is indicated with a dot pattern. Note that a difference between a display device DSP4 and the display device DSP10 illustrated in FIG. 10 will be mainly described, and a repeated description is omitted hereinafter.

In a case where the shape of the display region DA is neither a square nor a rectangle, some of the plurality of scanning signal lines GL differ from others in length of overlapping with the common electrode CE. For example, in the example illustrated in FIG. 13, in plan view, a length at which the scanning signal line GLA overlaps with the common electrode CE is shorter than a length at which the scanning signal line GLE overlaps with the common electrode CE. In other words, the number of the parasitic capacitances C4 (see FIG. 7) connected to a signal transmission path for transmitting the scanning signal Gsi (see FIG. 6) to the pixel PXE illustrated in FIG. 13 is larger than the number of the parasitic capacitances C4 connected to a signal transmission path for transmitting the scanning signal Gsi to the pixel PXA. Thus, when only the parasitic capacitance C4 illustrated in FIG. 7 is simply considered, the load given to the pixel PXE is larger than the load given to the pixel PXA. Then, in order to improve the display quality, it is preferred that the in-plane difference of the load given to each of the plurality of pixels PX be reduced as described above.

In the display device DSP4 illustrated in FIGS. 13 to 15, a part of the common electrode CE is in the peripheral region SA, and the scanning signal line GL and the common electrode CE overlap with each other in the peripheral region SA. For example, in a part illustrated in FIG. 14, in the region overlapping with the extension portion EXT3 in the peripheral region SA, the wiring portion GLPS of the scanning signal line GL overlaps with the common electrode CE. In this case, a length at which the scanning signal line GL (for example, the scanning signal line GLA) overlaps with the common electrode CE becomes longer than that in the display device DSP1 (see FIG. 8) and that in the display device DSP2 (see FIG. 10). That is, among the loads given to the pixel PXA connected to the scanning signal line GLA, the load corresponding to the parasitic capacitance C4 illustrated in FIG. 7 increases. Accordingly, the in-plane difference of the load given to each of the plurality of pixels PX can be reduced.

Also, in the display device DSP4, a length at which the wiring portion GLPS of the scanning signal line GL overlaps with the common electrode CE is not fixed. The length at which the wiring portion GLPS of the scanning signal line GL overlaps with the common electrode CE is different depending on the number of the video signal lines SL crossed by the scanning signal line GL. The larger the number of the video signal lines SL crossed thereby, the larger the load caused by the parasitic capacitance C1 illustrated in FIG. 7 becomes, whereby the load caused by the parasitic capacitance C4 may be small. Accordingly, the larger the number of the video signal lines SL crossed by the scanning signal line GL is, the shorter a distance at which the scanning signal line GL overlaps with the common electrode CE is. In contrast, in a case where the number of the video signal lines SL crossed thereby is small, the load caused by the parasitic capacitance C1 illustrated in FIG. 7 is small, whereby it is necessary to increase the overall load by increasing the load caused by the parasitic capacitance C4. Accordingly, it is preferred that the distance at which the scanning signal line GL overlaps with the common electrode CE be long as the number of the video signal lines SL crossed thereby is small.

As illustrated in FIG. 15, for example, the wiring portion GLPS of the scanning signal line GL overlaps with the common electrode CE in the region overlapping with the bent portion BEN1. Comparing the scanning signal line GLA illustrated in FIG. 14 with the scanning signal line GLD illustrated in FIG. 15, in plan view, the number of the video signal lines SL crossed by the scanning signal line GLA within the display region DA is smaller than the number of the video signal lines SL crossed by the scanning signal line GLD. In this case, in the peripheral region SA, a length at which the wiring portion GLPS of the scanning signal line GLA overlaps with the common electrode CE is longer than a length at which the wiring portion GLPS of the scanning signal line GLD overlaps with the common electrode CE. Also, similar to the display device DSP2 described with reference to FIG. 10, the scanning signal line GL crossing the maximum number of the video signal lines SL within the display region DA, like the scanning signal line GLE (see FIG. 13), for example, does not have the wiring portion GLPS. In this way, in a case where the length at which the wiring portion GLPS of the scanning signal line GL overlaps with the common electrode CE is different depending on the number of the video signal lines SL crossed by the scanning signal line GL, among the loads given to each of the plurality of pixels PX, it is possible to reduce the in-plane difference of the load caused by the parasitic capacitance C4 illustrated in FIG. 7.

Figure 16:
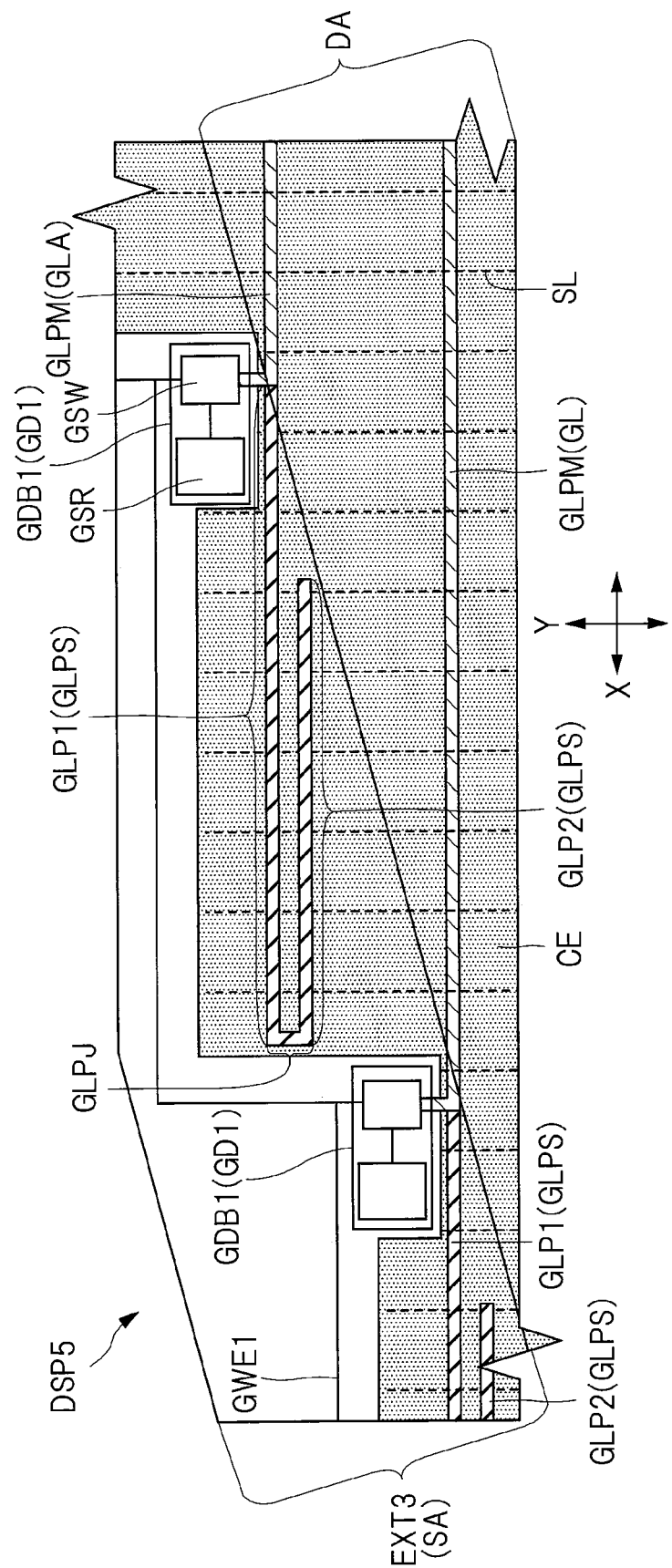
FIG. 16 is an enlarged plan view illustrating a circuit layout around a circuit block of a display device that is a modification of FIGS. 12 and 14.

It is also possible to use the technique described in the display device DSP4 illustrated in FIGS. 13 to 15 and the technique described in the display device DSP3 illustrated in FIG. 12 in combination. FIG. 16 is an enlarged plan view illustrating a circuit layout around a circuit block of a display device that is a modification of FIGS. 12 and 14. In a display device DSP5 illustrated in FIG. 16, the wiring portion GLPS of the scanning signal line GL (including at least the scanning signal line GLA) includes the wiring portion (first wiring portion) GLP1 connected to the wiring portion GLPM, and the wiring portion (second wiring portion) GLP2 connected to the wiring portion GLPS and extending in a position different from the wiring portion GLP1. The wiring portion GLP1 is on the extended line of the wiring portion GLPM and extends along the X direction. One end of the wiring portion GLP1 is connected to the wiring portion GLPM. The other end of the wiring portion GLP1 is connected to the wiring portion GLP2 via the wiring portion GLPJ extending along the Y direction. Also, the wiring portion GLP2 is not on the extended line of the wiring portion GLPM and extends along the X direction. Each of the wiring portion GLP1 and the wiring portion GLP2 overlaps with the common electrode CE in the peripheral region SA (more specifically, in the region overlapping with the extension portion EXT3). In the display device DSP5, a distance at which the scanning signal line GLA overlaps with the common electrode CE is much longer than that in the display device DSP4 illustrated in FIG. 14.

Next, a circuit layout in the peripheral region SA on the Y1 side opposite to the Y2 side in the Y direction illustrated in FIG. 1 will be described. To the other of the oblique sides of the display device DSP1 having the trapezoidal planar shape, or a side along the extension portion EXT4 (see FIG. 1), the switching circuit SWS is disposed, and the plurality of video signal lines SL extend toward the display region DA. Accordingly, it is difficult to dispose the driving circuit GD1 or the driving circuit GD2 along the extension portion EXT4. Thus, at a side on the Y1 side in the Y direction illustrated in FIG. 3, a circuit layout different from that at a side on the Y2 side is applied.

Figure 18:
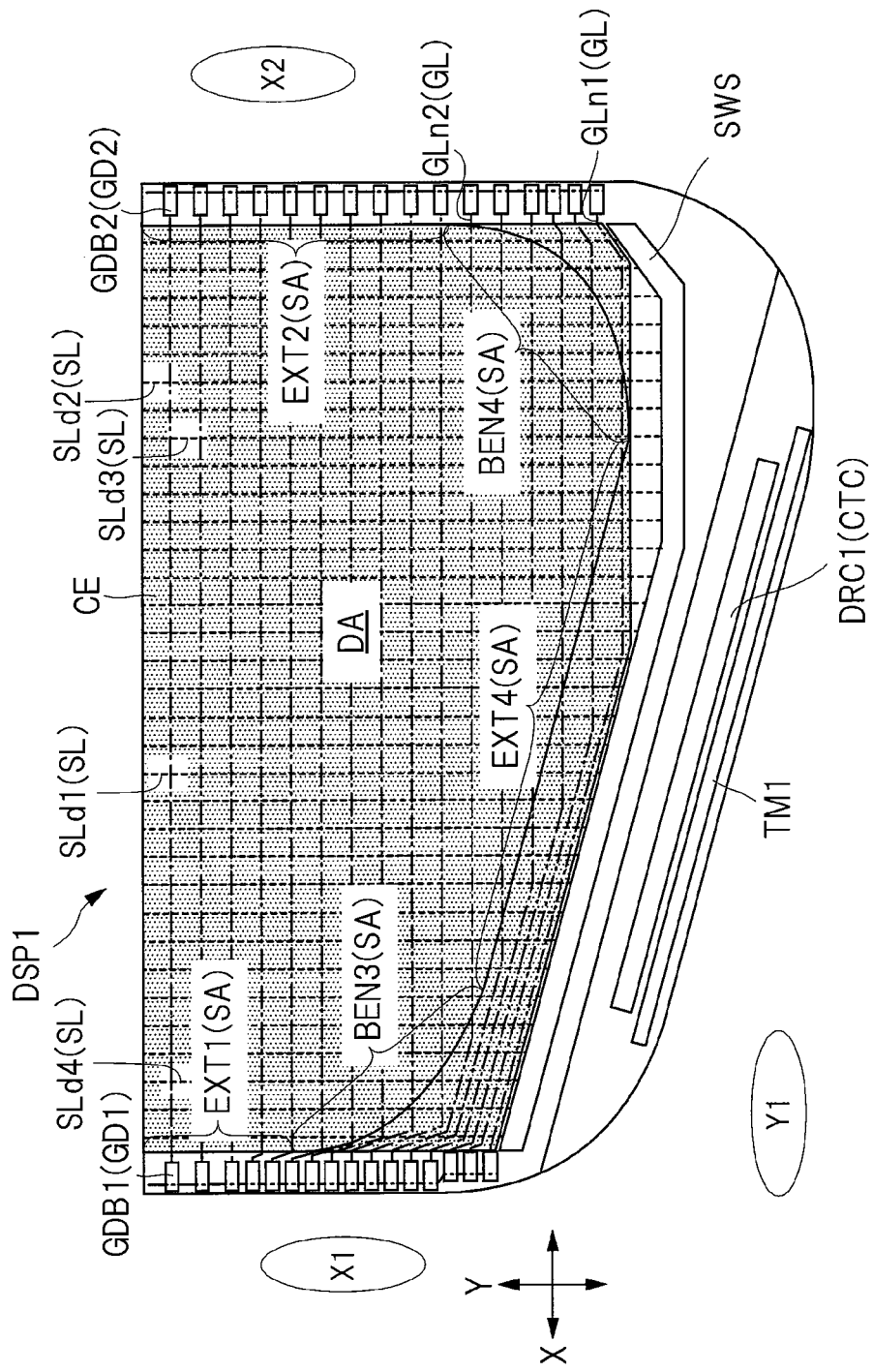
FIG. 18 is an enlarged plan view illustrating an exemplary layout of a common electrode on a plane illustrated in FIG. 17.

FIG. 17 is an enlarged plan view illustrating details of a circuit configuration of a lower side of the display device illustrated in FIG. 3. Also, FIG. 18 is an enlarged plan view illustrating an exemplary layout of a common electrode on a plane illustrated in FIG. 17. As illustrated in FIG. 17, the display device DSP1 is provided with the switching circuit (selection circuit) SWS between the display region DA and the driver chip DRC1 in which the control circuit CTC (see FIG. 6) is formed. Also, in plan view, there is neither the driving circuit GD1 nor the driving circuit GD2 between the switching circuit SWS and the display region DA. In this case, each of the plurality of video signal lines SL has no bent portion in the middle and extends linearly from the switch circuit SWS along the Y direction. The total number of the video signal lines SL is larger than the total number of the scanning signal lines GL. Accordingly, it is preferred that each of the plurality of video signal lines SL be not curved but be linearly extended.

Meanwhile, some of the plurality of scanning signal lines GL have the bent portion, like a scanning signal line GLn1 and a scanning signal line GLn2 illustrated in FIG. 17, for example. Specifically, the scanning signal line GLn1 and the scanning signal line GLn2 going through a region between the display region DA and the switch circuit SWS each have the bent portion in the peripheral region SA. A part of each of the scanning signal line GLn1 and the scanning signal line GLn2 extends in the region between the display region DA and the switch circuit SWS (in other words, a region between the display region DA and the control circuit CTC of the driver chip DRC1). However, each of the plurality of scanning signal lines GL extends along the X direction within the display region DA (in other words, within a section overlapping with the display region DA). Further, within the display region DA, each of the plurality of scanning signal lines GL is arrayed at an equal interval.

In a case where the both-side driving method is applied to each of the plurality of scanning signal lines GL, the number of the circuit blocks GDB1 constituting the driving circuit GD1 is the same as the number of the circuit blocks GDB2 constituting the driving circuit GD2. However, since the extension portion EXT1 and the extension portion EXT2 have different lengths as described above, respective spaces in which the circuit blocks GDB1 and GDB2 are disposed are different from each other. That is, as described above, the extension portion EXT2 is longer than the extension portion EXT1 in the Y direction. In this case, in a region overlapping with the extension portion EXT2, it is possible to secure a larger space in which the plurality of circuit blocks GDB2 constituting the driving circuit GD2 are disposed. Accordingly, the plurality of circuit blocks GDB2 are linearly arrayed along the Y direction. In other words, it is easy to dispose the plurality of circuit blocks GDB2 constituting the driving circuit GD2 by avoiding a space between the switching circuit SWS and the display region DA.

Meanwhile, a region overlapping with the extension portion EXT1 is a space in which the plurality of circuit blocks GDB1 constituting the driving circuit GD1 are disposed, and an area thereof is smaller than an area of the region overlapping with the extension portion EXT2. As a result, the plurality of circuit blocks GDB1 constituting the driving circuit GD1 are disposed not only in the region overlapping with the extension portion EXT1 but also in a region overlapping with the bent portion BEN3. The circuit blocks GDB1 overlapping with the bent portion BEN3 are disposed at a smaller pitch than the circuit blocks GDB2 overlapping with the extension portion EXT2. Accordingly, in the region on the Y2 side, the circuit block GDB1 and the circuit block GDB2, which are disposed in mutually different positions in the Y direction, may be connected via one scanning signal line GL. For example, each of the scanning signal line GLn1 and the scanning signal line GLn2 illustrated in FIG. 17 has one end connected to the circuit block GDB1 and the other end connected to the circuit block GDB2. Then, in the Y direction, the positions of the circuit block GDB1 and the circuit block GDB2 are different from each other.

Also, as illustrated in FIG. 17, within the display region DA, the number of the plurality of video signal lines SL crossed by the scanning signal line GLn1 is different from the number of the plurality of video signal lines SL crossed by the scanning signal line GLn2. In the example illustrated in FIG. 17, in plan view, within the display region DA, the number of the plurality of video signal lines SL crossed by the scanning signal line GLn1 is smaller than the number of the plurality of video signal lines SL crossed by the scanning signal line GLn2. The pixel PX illustrated in FIG. 7 is provided to each crossing between the scanning signal line GL and the video signal line SL, whereby a relation between the scanning signal line GLn1 and the scanning signal line GLn2 illustrated in FIG. 17 may be expressed as follows. That is, the number of the pixels PX connected to the scanning signal line GLn1 is smaller than the number of the pixels PX connected to the scanning signal line GLn2. Also, since each pixel PX includes the transistor (pixel transistor) Tr1, it may also be expressed as follows. The number of the transistors Tr1 connected to the scanning signal line GLn1 is smaller than the number of the transistors Tr1 connected to the scanning signal line GLn2.

In the example illustrated in FIG. 17, in plan view, the number of the plurality of video signal lines SL crossed by the scanning signal line GLn1 is the same as the number of the plurality of video signal lines SL crossed by the scanning signal line GLn2. Accordingly, among the load factors given to each of the plurality of pixels PX illustrated in FIG. 7, the load caused by the parasitic capacitance C1 is made even. However, there is a possibility that the load caused by the parasitic capacitance C3 may have a large in-plane difference due to the following reason.

That is, the parasitic capacitance C3 changes with the number of the transistors Tr1 connected to the scanning signal lines GL. As illustrated in FIG. 17, in a case where the number of the transistors Tr1 (see FIG. 7) connected to the scanning signal line GLn1 is smaller than the number of the transistors Tr1 connected to the scanning signal line GLn2, the load given to the scanning signal line GLn1 becomes relatively small. As a method for reducing the in-plane difference of the load caused by the parasitic capacitance C3, there is a method for reducing a difference in the number of the transistors Tr1 connected to the plurality of scanning signal lines GL by disposing a transistor (a transistor of a dummy pixel and the like) having a similar structure as that of the transistor Tr1 in the peripheral region SA. However, as illustrated in FIG. 17, in the region between the display region DA and the switch circuit SWS, a part of the scanning signal lines GL are lead out toward the Y1 side of a connecting position with the circuit block GDB1 and are arrayed at an arrangement pitch, which is narrower than that in another region, along the outer edge portion (a side of an outer periphery) of the display region DA. Also, since the arrangement pitch of the plurality of circuit blocks GDB1 is narrower in this region, there is a region in which an arrangement density of the scanning signal lines GL is locally high. In FIG. 17, in the region between the display region DA and the switch circuit SWS, there are a part in which the plurality of scanning signal lines GL orthogonally cross the plurality of video signal lines SL in plan view, and a part in which the plurality of scanning signal lines GL cross the plurality of video signal lines SL at an angle other than the right angle. Then, in the part in which the plurality of scanning signal lines GL cross the plurality of video signal lines SL at an angle other than the right angle, the arrangement density of the scanning signal lines GL is relatively high. In this way, it is difficult to dispose the transistor Tr1 in the region where the arrangement density of the scanning signal lines GL is high.

Thus, to the scanning signal lines GL going through the region between the display region DA and the switch circuit SWS, it is preferred that variation of the load caused by the parasitic capacitance C3 be compensated by another load. For example, as illustrated in FIG. 18, a length at which the scanning signal line GLn1 overlaps with the common electrode CE is longer than a length at which the scanning signal line GLn2 overlaps with the common electrode CE. Accordingly, considering the parasitic capacitance C4 (see FIG. 7), the load caused by the parasitic capacitance C4 given to the scanning signal line GLn1 is larger than the load caused by the parasitic capacitance C4 given to the scanning signal line GLn2. In this case, it is possible to reduce variation of the load as a whole by compensating for the variation of the load caused by the parasitic capacitance C3 by the load caused by the parasitic capacitance C4.

Also, as illustrated in FIGS. 17 and 18, the scanning signal line GLn1 is disposed closer to the switch circuit SWS, or in other words, closer to the control circuit CTC of the driver chip DRC1, than the scanning signal line GLn2.

Also, a length of the scanning signal line GLn1 is longer than a length of the scanning signal line GLn2. Accordingly, considering the load caused by the wiring resistance of the scanning signal lines GL, a load caused by the wiring resistance of the scanning signal line GLn1 is larger than a load caused by the wiring resistance of the scanning signal line GLn2. In this case, it is possible to reduce the variation of the load as a whole by compensating for the variation of the load caused by the parasitic capacitance C3 by the load caused by the wiring resistance.

Next, among the load factors given to each of the plurality of pixels PX illustrated in FIG. 7, a load caused by the parasitic capacitance C2 between the video signal line SL and the transistor Tr1 will be considered. Capacitance caused by the parasitic capacitance C2 illustrated in FIG. 7 changes with the number of the transistors Tr1 connected to the video signal line SL. Accordingly, in a case where the number of the transistors Tr1 connected to each of the plurality of video signal lines SL is different from each other, there is variation of the load caused by the parasitic capacitance C2 given to each of the plurality of video signal lines SL. Also, as illustrated in FIG. 3, each of the plurality of video signal lines SL extends in the Y direction, and the plurality of video signal lines SL differ from each other in length of overlapping with the display region DA. For example, in the example illustrated in FIG. 3, a length at which a video signal line SLm being closer to the X2 side than the video signal line SL1 overlaps with the display region DA is longer than a length at which a video signal line SL1 overlaps with the display region DA. Also, in the example illustrated in FIG. 17, the display device DSP1 includes a video signal line (first video signal line) SLd1 and a video signal line (second video signal line) SLd2. A length at which the video signal line SLd2 overlaps with the display region DA is longer than a length at which the video signal line SLd1 overlaps with the display region DA. In this case, in plan view, the number of the transistors Tr1 (see FIG. 7) connected to the video signal line SLd1 is smaller than the number of the transistors Tr1 connected to the video signal line SLd2. Accordingly, the load caused by the parasitic capacitance C2 given to the video signal line SLd1 is smaller than the load caused by the parasitic capacitance C2 given to the video signal line SLd2.

The peripheral region SA, which is located between the display region DA and the switch circuit SWS illustrated in FIG. 18, includes a region overlapping with the common electrode CE and a region not overlapping with the common electrode CE. At least the video signal line SLd2 has a part not overlapping with the common electrode CE in the peripheral region SA. In the peripheral region SA, a length at which the video signal line SLd1 overlaps with the common electrode CE is longer than a length at which the video signal line SLd2 overlaps with the common electrode CE. Here, among the load factors given to each of the plurality of pixels PX illustrated in FIG. 7, the load caused by the parasitic capacitance C5 between the video signal line SL and the common electrode CE increases in proportion to the length at which the video signal lines SL overlaps with the common electrode CE. Accordingly, a load caused by the parasitic capacitance C5 given to the video signal line SLd1 in the peripheral region SA is larger than a load caused by the parasitic capacitance C5 given to the video signal line SLd2. Accordingly, it is possible to reduce the variation of the load as a whole by compensating for the variation of the load caused by the parasitic capacitance C2 by the load caused by the parasitic capacitance C5.

Note that the above description that "in the peripheral region SA, a length at which the video signal line SLd1 overlaps with the common electrode CE is longer than a length at which the video signal line SLd2 overlaps with the common electrode CE" includes not only an aspect in which each of the video signal line SLd1 and the video signal line SLd2 overlaps with the common electrode CE in the peripheral region SA, but also an aspect in which the video signal line SLd2 does not overlap with the common electrode CE in the peripheral region SA.

Also, in the example illustrated in FIG. 17, each of the plurality of video signal lines SL has a different length from the switching circuit SWS to the display region DA. The plurality of video signal lines SL include a video signal line (third video signal line) SLd3 and a video signal line (fourth video signal line) SLd4. In plan view, a length of the video signal line SLd4 from the switching circuit SWS to the display region DA is longer than a length of the video signal line SLd3 from the switching circuit SWS to the display region DA. As illustrated in FIG. 17, among the plurality of scanning signal lines GL, the scanning signal line GLn1 disposed in a position the closest to the switching circuit SWS crosses the video signal line SLd3 within the display region DA. Since the video signal line SLd3 does not need to cross the scanning signal line GL outside the display region DA (that is, in the peripheral region SA), it is possible to make the length to the switch circuit SWS relatively short. In contrast, the scanning signal line GLn1 crosses the video signal line SLd4 outside the display region DA (more specifically, between the display region DA and the switching circuit SWS). When the length of the video signal line SLd4 from the switch circuit SWS to the display region DA is long, it is possible to cross the plurality of scanning signal lines GL with the video signal line SLd4 in the peripheral region SA.

By allowing some of the plurality of scanning signal lines GL to cross the video signal lines SLd4 outside the display region DA) in this way, it is possible to make the number of crossing between each of the plurality of video signal line SL and each of the plurality of scanning signal lines GL even. As described with reference to FIG. 7, the parasitic capacitance C1 between the scanning signal line GL and the video signal line SL is one of the load factors given to the pixel PX. Thus, by making the number of crossing between each of the plurality of video signal lines SL and each of the plurality of scanning signal lines GL even, it is possible to reduce variation in in-plane distribution of the load given to the pixel PX.

Also, in the example illustrated in FIG. 18, a length at which the video signal line SLd3 overlaps with the common electrode CE is longer than a length at which the video signal line SLd4 overlaps with the common electrode CE. In contrast, in the peripheral region SA, the length at which the video signal line SLd4 overlaps with the common electrode CE is longer than the length at which the video signal line SLd3 overlaps with the common electrode CE. The video signal line SLd4 is closer to the X1 side than the video signal line SLd3 and has a shorter overall length. Accordingly, within the display region DA, the length at which the video signal line SLd3 overlaps with the common electrode CE is longer than the length at which the video signal line SLd4 overlaps with the common electrode CE. In this case, there is variation of the load caused by the parasitic capacitance C5 described with reference to FIG. 7. As illustrated in FIG. 18, in the peripheral region SA, in a case where the length at which the video signal line SLd4 overlaps with the common electrode CE is longer than the length at which the video signal line SLd3 overlaps with the common electrode CE, it is possible to reduce the variation of the load caused by the parasitic capacitance C5.

In the foregoing, the technique found by the inventor of the present application has been concretely described based on the embodiments by way of example. However, the present invention is not limited to the foregoing embodiments and various modifications and alterations can be made within the scope of the present invention.

For example, in the above-described embodiment, a case of a liquid crystal display device has been exemplified as an exemplary disclosure; however, as another exemplary application, it is possible to list all sorts of flat panel display devices such as an organic EL display device and another light emitting display device as well as an electronic paper display device having an electrophoretic element and the like. Also, it is applicable to any size of display device, from a small-sized display device to a large-sized display device, without any limitation in particular.

For example, as one example of a display device having a display region of an irregular shape other than a square or a rectangle, the display device having the trapezoidal display region has been described. The shape of the display region DA, however, may also be other than a trapezoid as well. For example, the shape of the display region DA may also be a parallelogram.

In the above-described embodiment, for example, as illustrated in FIG. 3, there has been described the aspect in which both of ends of each of the plurality of scanning signal lines GL are connected to the driving circuit GD1 and the driving circuit GD2 and the display region DA as a whole is driven by the both-side driving method. However, as a modification, it is also possible to drive the display region DA as a whole by the one-side driving method. In this case, for example, no driving circuit GD1 illustrated in FIG. 3 is disposed, and all of the scanning signal lines GL are driven by the driving circuit GD2 by the one-side driving method. It is also possible that each of the plurality of scanning signal lines GL is connected to either one of the driving circuit GD1 and the driving circuit GD2 and not to the other.

Figure 19:
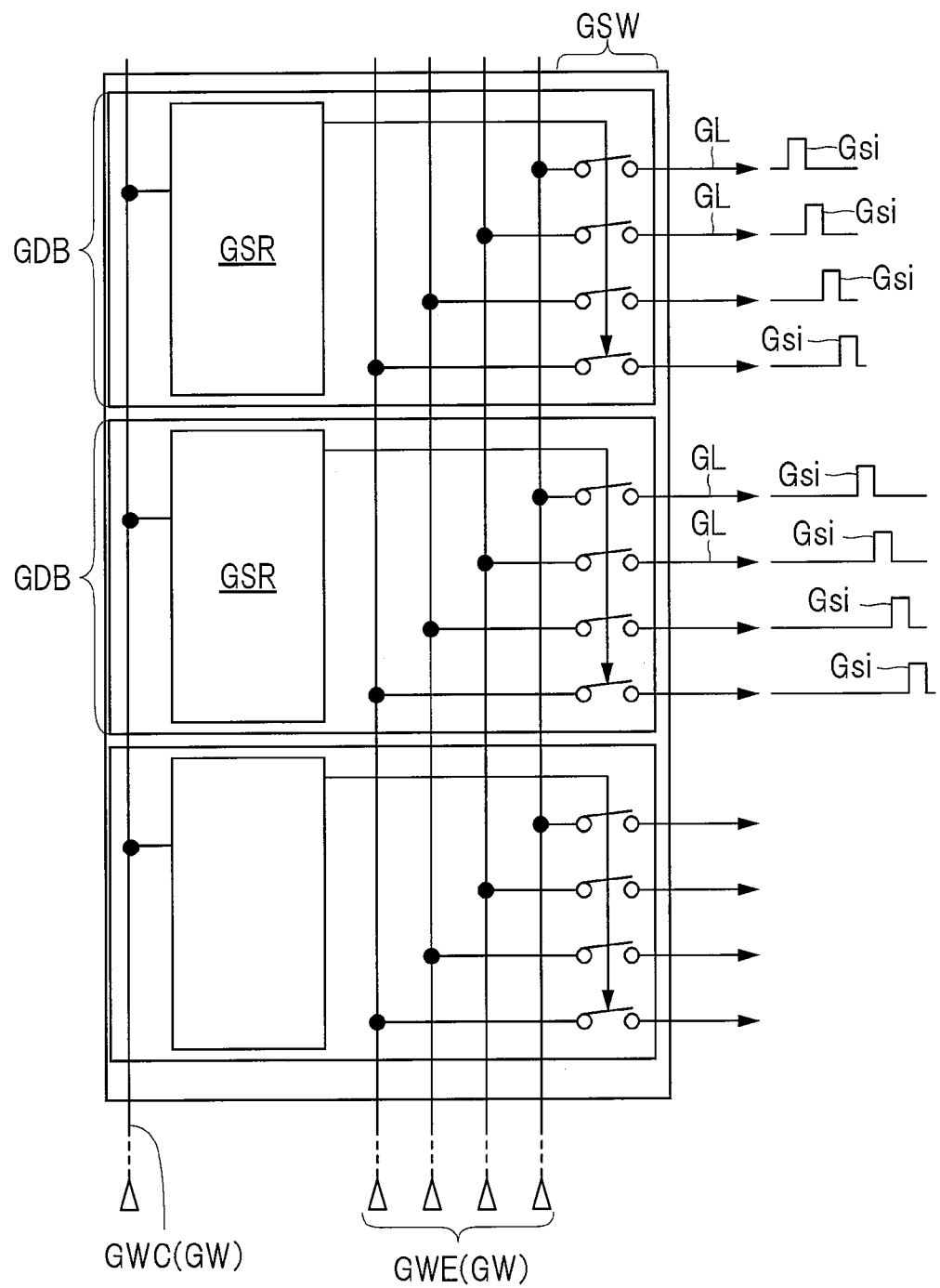
FIG. 19 is a circuit block diagram illustrating a modification of the circuit block illustrated in FIG. 6.

For example, in each of the drawings such as FIG. 6 that illustrates a relation between the driving circuit GD and the scanning signal line GL connected to the driving circuit GD, there has been also described an example in which one scanning signal line GL is connected to each of the circuit blocks GDB in which one switching circuit GSW is connected to one shift register circuit GSR. It is necessary that the switching circuit GSW correspond to the scanning signal line GL on a one-to-one basis; however, as in a modification illustrated in FIG. 19, for example, it is also possible to connect the plurality of switching circuits GSW to one shift register circuit GSR. FIG. 19 is a circuit block diagram illustrating a modification of the circuit block illustrated in FIG. 6. In the example illustrated in FIG. 19, four switching circuits GSW are connected to each of the plurality of shift register circuits GSR. A set of one shift register circuit GSR and four switching circuits GSW constitutes one circuit block. Also, to each of the plurality of switching circuits, one scanning signal line GL is connected.

Also, in the modification illustrated in FIG. 19, each of the enable line GWE independent from each other is connected to each of the switching circuits GSW included in one circuit block GDB. In this case, by combining a pulse signal supplied from the shift register circuit GSR with a pulse signal supplied from the enable line GWE, it is possible to sequentially transmit the scanning signal Gsi (see FIG. 6) to each of the plurality of scanning signal lines GL. In the modification illustrated in FIG. 19, compared to the example described with reference to FIG. 6, it is possible to reduce the number of the shift register circuits GSR. Also, on the assumption that the number of the scanning signal lines GL is the same as that in the example illustrated in FIG. 6, as illustrated in FIG. 19, a configuration in which each of the plurality of scanning signal lines GL is connected to any of the plurality of enable lines GWE independent from each other is advantageous from the following point. That is, since the number of the switching circuits GSW connected to the enable line GWE becomes small (¼) in the example of the drawing, it is possible to reduce a load capacity of the enable lines GWE.

Also, in the present specification, various aspects based on the technical idea thereof have been described by dividing the aspects into multiple modifications, and a repeated description is omitted on a common part of the multiple aspects (modifications). Accordingly, it is also possible to apply two or more of the above-described multiple modifications in combination.

Various modifications and alterations can be conceived by those skilled in the art within the spirit of the present invention, and it is understood that such modifications and alterations are also encompassed within the scope of the present invention.

For example, those skilled in the art can suitably modify the above-described embodiment by addition, deletion, or design change of components, or by addition, omission, or condition change of steps. Such modifications are also encompassed within the scope of the present invention as long as they include the gist of the present invention.

The present invention is effective when applied to an input device and a display device provided with an input detection function.

What is claimed is:

1. A display device comprising:
   a substrate including a display region and a peripheral region surrounding the display region;
   a plurality of video signal lines provided on the substrate and extended to a first direction;
   a plurality of scanning signal lines provided on the substrate and extended to a second direction crossing the first direction;
   a first potential supply line electrically connected to the plurality of scanning signal lines; and
   a driving chip provided in the peripheral region on the substrate,
   wherein the substrate includes a first side extending along the first direction, a second side opposed to the first side, a third side extending along the second direction and connecting the first side and the second side, and a fourth side opposed to the third side and connecting the first side and the second side,
   the driving chip is provided along the fourth side,
   the first potential supply line includes a first part provided along the first side and a second part provided along the third side,
   the plurality of scanning signal lines are provided in a first wiring layer,
   the plurality of scanning signal lines are provided in a second wiring layer which is provided on the first wiring layer,
   the second part of the first potential supply line is provided in the first wiring layer and the second wiring layer,
   the first part of the first potential supply line is provided in the second wiring layer and is not provided in the first wiring layer,
   the plurality of scanning signal lines include a first scanning signal line and a second scanning signal line which is closer to the driving chip than the first scanning signal line,
   in a plan view, a number of the plurality of video signal lines crossed by the first scanning signal line is different from a number of the plurality of video signal lines crossed by the second scanning signal line within the display region.

2. The display device according to claim 1, further comprising:
   a first driving circuit supplying a scanning signal and provided in the peripheral region,
   wherein the first driving circuit is provided along the first side and the third side.

3. The display device according to claim 2, wherein the first potential supply line supplies a potential to the plurality of scanning signal lines via the first driving circuit.

4. The display device according to claim 1, wherein the second wiring layer is made of a material having resistivity lower than that of the first wiring layer.

5. The display device according to claim 1, further comprising:
   a second driving circuit supplying a scanning signal and provided in the peripheral region,
   wherein the second driving circuit is provided along the second side.

6. The display device according to claim 5, further comprising:
   a second potential supply line electrically connected to the plurality of scanning signal lines,
   wherein the second potential supply line supplies a potential to the plurality of scanning signal lines via the second driving circuit.

7. The display device according to claim 6, wherein the first driving circuit includes a first A circuit block and a first B circuit block,
   the first potential supply line is provided in the first wiring layer between the first A circuit block and the first B circuit block,
   the second driving circuit includes a second A circuit block and a second B circuit block,
   the second potential supply line is provided in the first wiring layer between the second A circuit block and the second B circuit block,
   the first A circuit block and the second A circuit block are connected to a same scanning signal line among the plurality of scanning signal lines.

8. The display device according to claim 7, wherein a distance between the first A circuit block and the first B circuit block is longer than a distance between the second A circuit block and the second B circuit block.

9. The display device according to claim 1, wherein the first driving circuit includes a first A circuit block, a first B circuit block, a first C circuit block, and a first D circuit block,
   the first B circuit block is between the first A circuit block and the first C circuit block,
   the first C circuit block is between the first B circuit block and the first D circuit block,
   the first A circuit block is closer to the second side than the first B circuit block, the first D circuit block is closer to the first side than the first C circuit block, and a distance between the first A circuit block and the first B circuit block is longer than a distance between the first C circuit block and the first D circuit block.

10. The display device according to claim 2, wherein the first scanning signal line includes a main wiring portion connected to the first driving circuit, and a sub-wiring portion connected to the main wiring portion and extending to the first side from the main wiring portion, and in a plan view, the sub-wiring portion is in the peripheral region and crosses the video signal lines.

11. The display device according to claim 10, further comprising:

an electro-optical layer;

a plurality of first electrodes driving the electro-optical layer; and a second electrode facing the plurality of first electrodes, wherein the sub-wiring portion overlaps with the second electrode.

12. A display device comprising:

a display region in which a plurality of pixels is arrayed;

a peripheral region surrounding the display region;

a plurality of video signal lines extended to a first direction;

a plurality of scanning signal lines extended to a second direction crossing the first direction;

a first control circuit supplying a video signal;

a first driving circuit and a second driving circuit supplying a scanning signal;

a plurality of first electrodes provided in the plurality of pixels; and a second electrode opposed to the plurality of first electrodes, wherein the plurality of scanning signal lines include a first scanning signal line and a second scanning signal line, in a plan view, a number of the plurality of video signal lines crossed by the first scanning signal line is smaller than a number of the plurality of video signal lines crossed by the second scanning signal line in the display region, and a length at which the first scanning signal line overlaps with the second electrode is longer than a length at which the second scanning signal line overlaps with the second electrode, the first scanning signal line overlaps with the second electrode in the peripheral region, and the second scanning signal line does not overlap with the second electrode in the peripheral region.

13. The display device according to claim 12, wherein the first scanning signal line includes a main wiring portion connected to the first driving circuit, and a sub-wiring portion connected to the main wiring portion and extending to the first side from the main wiring portion, and in a plan view, the sub-wiring portion is in the peripheral region and crosses the video signal lines.

\* \* \* \* \*